(12) United States Patent
Fujii et al.

(10) Patent No.: US 11,049,640 B2
(45) Date of Patent: Jun. 29, 2021

(54) CIRCUIT DEVICE AND POWER CONVERTER

(71) Applicant: MITSUBISHI ELECTRIC CORPORATION, Tokyo (JP)

(72) Inventors: Kenta Fujii, Tokyo (JP); Koji Nakajima, Tokyo (JP); Yuji Shirakata, Tokyo (JP); Jun Tahara, Tokyo (JP); Takashi Kumagai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 521 days.

(21) Appl. No.: 16/069,375

(22) PCT Filed: Jan. 4, 2017

(86) PCT No.: PCT/JP2017/000030
§ 371 (c)(1),
(2) Date: Jul. 11, 2018

(87) PCT Pub. No.: WO2017/126315
PCT Pub. Date: Jul. 27, 2017

(65) Prior Publication Data
US 2019/0019609 A1    Jan. 17, 2019

(30) Foreign Application Priority Data

Jan. 21, 2016   (JP) .............................. JP2016-009910

(51) Int. Cl.
*H01F 27/08* (2006.01)
*H01F 27/22* (2006.01)
(Continued)

(52) U.S. Cl.
CPC ............. *H01F 27/08* (2013.01); *H01F 27/22* (2013.01); *H01F 27/24* (2013.01);
(Continued)

(58) Field of Classification Search
CPC ........ H01F 27/08; H01F 27/22; H01F 27/306; H01F 27/24
(Continued)

(56) References Cited

U.S. PATENT DOCUMENTS

2011/0102121 A1*   5/2011   Otsuka ..................... H01F 27/06
                                                        336/192
2012/0161911 A1*   6/2012   Moiseev ................. H01F 27/02
                                                        336/55
(Continued)

FOREIGN PATENT DOCUMENTS

CN         105378863 A        3/2016
DE     102012214371 A1        8/2013
(Continued)

OTHER PUBLICATIONS

International Search Report (PCT/ISA/210) dated Feb. 21, 2017, by the Japan Patent Office as the International Searching Authority for International Application No. PCT/JP2017/000030.
(Continued)

*Primary Examiner* — Shawki S Ismail
*Assistant Examiner* — Kazi S Hossain
(74) *Attorney, Agent, or Firm* — Buchanan Ingersoll & Rooney PC

(57) ABSTRACT

A circuit device and a power converter include a core, a coil surrounding at least a part of the core, and a first heat transfer member being in surface contact with the core. A temperature rise of the core can thus be prevented or reduced.

12 Claims, 25 Drawing Sheets

(51) Int. Cl.
  *H01F 27/30*  (2006.01)
  *H01F 27/24*  (2006.01)
  *H01F 27/28*  (2006.01)
  *H02M 3/335*  (2006.01)
  *H02M 7/00*  (2006.01)
  *H05K 7/20*  (2006.01)

(52) U.S. Cl.
  CPC ....... *H01F 27/2804* (2013.01); *H01F 27/306* (2013.01); *H02M 3/33569* (2013.01); *H02M 7/003* (2013.01); *H05K 7/209* (2013.01); *H01F 2027/2819* (2013.01)

(58) Field of Classification Search
  USPC .............................................. 336/61, 55–60
  See application file for complete search history.

(56) References Cited

U.S. PATENT DOCUMENTS

| | | | | |
|---|---|---|---|---|
| 2013/0265129 | A1* | 10/2013 | Ansari | .................... H01F 27/22 336/61 |
| 2015/0170819 | A1* | 6/2015 | Yamashima | ............ H01F 27/22 336/61 |
| 2015/0294782 | A1 | 10/2015 | Moiseev | |
| 2015/0357923 | A1 | 12/2015 | Nakazawa et al. | |
| 2016/0078993 | A1 | 3/2016 | Cedell et al. | |

FOREIGN PATENT DOCUMENTS

| | | |
|---|---|---|
| DE | 102015105388 A1 | 10/2015 |
| JP | 2007227640 A | 9/2007 |
| JP | 2010-003926 A | 1/2010 |
| JP | 2012-238743 A | 12/2012 |
| JP | 2013-168401 A | 8/2013 |
| JP | 2014-086432 A | 5/2014 |
| JP | 2014-090523 A | 5/2014 |
| JP | 2014-131394 A | 7/2014 |
| JP | 2014-204487 A | 10/2014 |

OTHER PUBLICATIONS

Written Opinion (PCT/ISA/237) dated Feb. 21, 2017, by the Japan Patent Office as the International Searching Authority for International Application No. PCT/JP2017/000030.

Chinese Office Action dated Nov. 25, 2019 issued in corresponding Chinese Patent Application No. 201780007512.2, with English translation (14 pages).

Office Action dated Feb. 5, 2021 issued in corresponding German Patent Application No. 112017000450.0.

\* cited by examiner 42 43 24 40 25 38 32 26 53 52

27 24 25 38 26 28

CIRCUIT DEVICE AND POWER CONVERTER

TECHNICAL FIELD

The present invention relates to a circuit device and a power converter.

BACKGROUND ART

A circuit device including a transformer and a smoothing choke is known (see PTD1). In the operation of the circuit device, the core of the transformer and the smoothing choke of the circuit device generates heat, increasing the temperature of the core. With an increasing temperature of the core, losses in the core, such as eddy current loss and hysteresis loss increase. To prevent or reduce a temperature rise of the core, the circuit device described in PTD1 includes a core, a metal housing, and a plate spring that presses the core against the metal housing. The heat generated in the core during the operation of the circuit device is transferred via the plate spring to the metal frame, and the heat is dissipated from the metal frame to the outside.

CITATION LIST

Patent Document

PTD 1: Japanese Patent Laying-Open No. 2014-131394

SUMMARY OF INVENTION

Technical Problem

However, the plate spring is in line contact with the core in the circuit device described in PTD1, resulting in a small contact area between the plate spring and the core. The heat generated in the core during the operation of the circuit device thus fails to be dissipated sufficiently to the outside of the circuit device, resulting in a difficulty of preventing or reducing a temperature rise of the core.

The present invention has been made in view of the above problem, and therefore has an object to provide a circuit device and a power converter capable of preventing or reducing a temperature rise of a core.

Solution to Problem

A circuit device and a power converter of the present invention include a core, a coil surrounding at least a part of the core, and a first heat transfer member being in surface contact with the core.

Advantageous Effects of Invention

In the circuit device and the power converter of the present invention, the first heat transfer member is in surface contact with the core. The first heat transfer member is thus in contact with the core in a larger area, which can reduce the heat resistance between the first heat transfer member and the core. The heat generated in the core during the operation of the circuit device and the power converter can be dissipated with a lower heat resistance to the first heat transfer member being in surface contact with the core. The circuit device and the power converter of the present invention can prevent or reduce a temperature rise of the core.

DESCRIPTION OF EMBODIMENTS

Embodiments of the present invention will be described below. The same or corresponding components are denoted by the same reference signs, and a description thereof will not be repeated.

Embodiment 1

Figure 1:
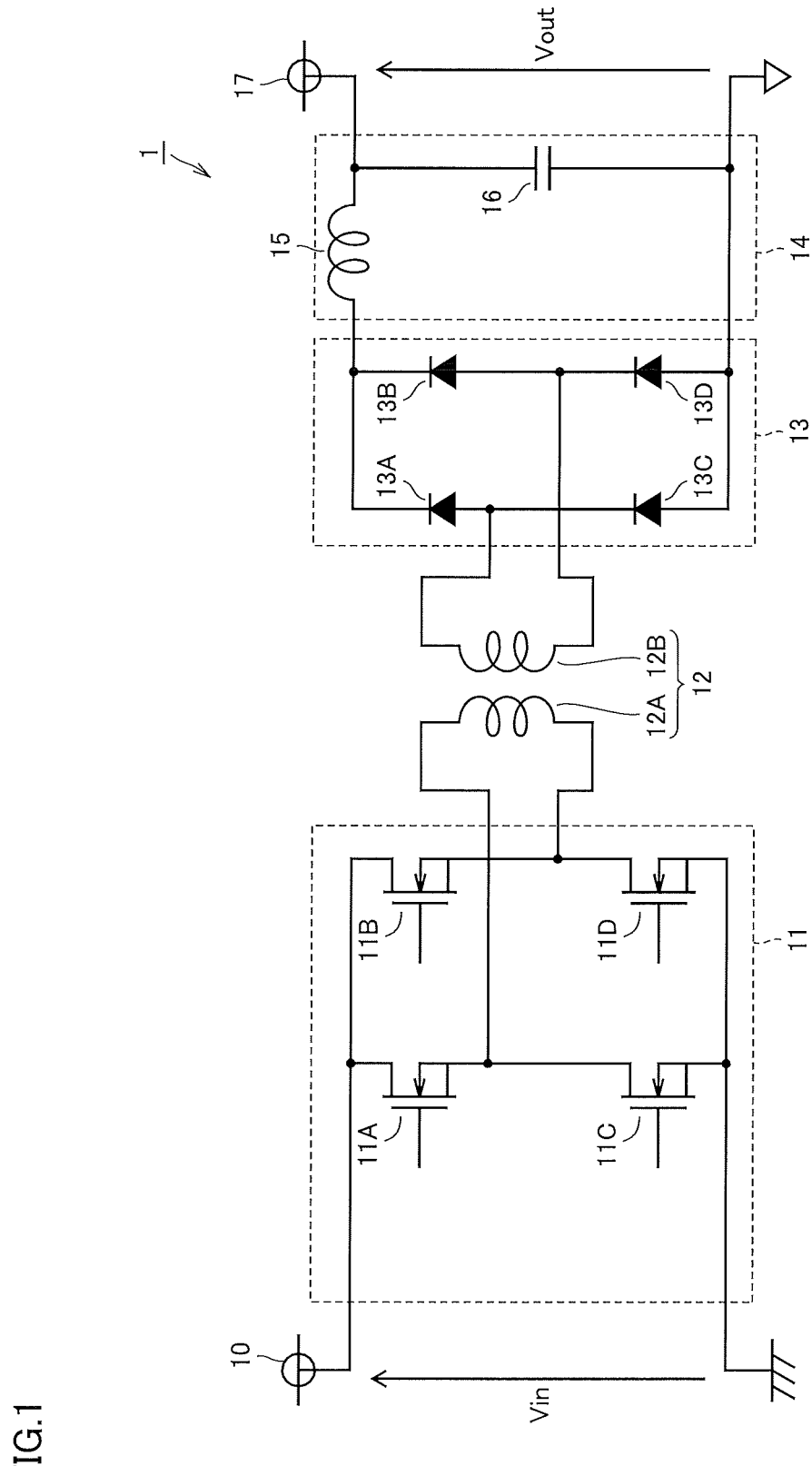
FIG. 1 is a circuit diagram of a power converter according to Embodiment 1 of the present invention.

An example of the circuitry of a power converter 1 according to the present embodiment will be described with reference to FIG. 1. Power converter 1 of the present embodiment may be a vehicular DC-DC converter. Power converter 1 includes an input terminal 10, an inverter circuit 11 connected to input terminal 10, a transformer 12 connected to inverter circuit 11, a rectifier circuit 13 connected to transformer 12, a smoothing circuit 14 connected to rectifier circuit 13, and an output terminal 17 connected to smoothing circuit 14.

Inverter circuit 11 includes primary switching elements 11A, 11B, 11C, and 11D. Transformer 12 is composed of a primary coil conductor 12A connected to inverter circuit 11 and a secondary coil conductor 12B magnetically coupled to primary coil conductor 12A. Secondary coil conductor 12B is connected to rectifier circuit 13. Rectifier circuit 13 includes secondary switching elements 13A, 13B, 13C, and 13D. Smoothing circuit 14 includes a smoothing choke 15 and a capacitor 16. Primary switching elements 11A, 11B, 11C, and 11D and secondary switching elements 13A, 13B, 13C, and 13D may be, for example, MOSFETs (Metal Oxide Semiconductor Field Effect Transistors) or IGBTs (Insulated Gate Bipolar Transistors). Primary switching elements 11A, 11B, 11C, and 11D and secondary switching elements 13A, 13B, 13C, and 13D may be semiconductor elements made of a semiconductor material such as silicon (Si), silicon carbide (SiC), or gallium nitride (GaN).

For example, power converter 1 of the present embodiment may convert a DC voltage of approximately 100 V to approximately 600 V supplied to input terminal 10 into a DC voltage of approximately 12 V to approximately 16 V and then output the resultant DC voltage from output terminal 17. Specifically, a high DC voltage supplied to input terminal 10 is converted into a first AC voltage by inverter circuit 11. The first AC voltage is converted into a second AC voltage lower than the first AC voltage by transformer 12. The second AC voltage is rectified by rectifier circuit 13. Smoothing circuit 14 smoothens the voltage output from rectifier circuit 13 and then outputs a low DC voltage to output terminal 17.

A circuit device 20 of the present embodiment will be described with reference to FIGS. 2 to 4. The region of power converter 1 which includes smoothing choke 15 may be circuit device 20 of the present embodiment. Circuit device 20 of the present embodiment may be transformer 12, an electric component such as a reactor or motor, or an electromagnetic noise removing component including a ring-shaped ferrite core. Circuit device 20 of the present embodiment mainly includes a core 30, a coil 38, and a first heat transfer member 40. Circuit device 20 of the present embodiment may further include a first heat dissipation member 29, a substrate 21, a first support strut 42, and a second support strut 52.

Substrate 21 has a first main surface 22 and a second main surface 23 opposite to first main surface 22. Substrate 21 may be a printed circuit board. Substrate 21 may be a single-sided circuit board in which coil 38 is disposed on first main surface 22. Substrate 21 may be a double-sided circuit board in which coil 38 is disposed on first main surface 22 and second main surface 23. Substrate 21 may be a multilayer circuit board including a multilayer coil 38 in first main surface 22 and second main surface 23 as well as inside substrate 21. Substrate 21 may be a glass epoxy substrate such as FR-4 substrate.

Substrate 21 may have through-holes 24, 25, 26, 27, and 28 penetrating between first main surface 22 and the second main surface. Through-hole 24 receives a first leg portion 32a of a second core portion 32. Through-hole 25 receives a second leg portion 32b of second core portion 32. Through-hole 26 receives a third leg portion 32c of second core portion 32. Through-hole 27 receives first support strut 42. Through-hole 28 receives second support strut 52. Substrate 21 may be supported above first heat dissipation member 29 by first support strut 42 and second support strut 52. Substrate 21 may be supported above first heat dissipation member 29 by a support strut (not shown).

Core 30 may have a top portion 33, a bottom portion 34 opposite to top portion 33, and a lateral portion 35 between top portion 33 and bottom portion 34. Top portion 33 may be a flat surface extending along first main surface 22 of substrate 21. Bottom portion 34 may be a flat surface extending along second main surface 23 of substrate 21. Lateral portion 35 may be a lateral surface connecting top portion 33 and bottom portion 34.

Core 30 may include first core portion 31 and second core portion 32. First core portion 31 may be located below second main surface 23 of substrate 21. Second core portion 32 may be located above first main surface 22 of substrate 21. First core portion 31 may be placed on first heat dissipation member 29. Second core portion 32 may be disposed on first core portion 31. Core 30 may be an EI core. First core portion 31 may have an I-shape, and second core portion 32 may have an E-shape. Core 30 may be an EE core, a U core, an EER core, or an ER core. Core 30 may be a ferrite core of Mn—Zn ferrite or Ni—Zn ferrite, an amorphous core, or an iron dust core.

In the present embodiment, second core portion 32 may have first leg portion 32a, second leg portion 32b, and third leg portion 32c. Second leg portion 32b may be positioned between first leg portion 32a and third leg portion 32c. First leg portion 32a of second core portion 32 may pass through through-hole 24 from the first main surface 22 side. Second leg portion 32b of second core portion 32 may pass through through-hole 25 from the first main surface 22 side. Third leg portion 32c of second core portion 32 may pass through through-hole 26 from the first main surface 22 side. Core 30 includes a penetration portion penetrating between first main surface 22 and second main surface 23. The penetration portion of core 30 may include second leg portion 32b of second core portion 32. First leg portion 32a and third leg portion 32c of second core portion 32 may be in contact with the main surface of first core portion 31. Second leg portion 32b of second core portion 32 may be in contact with the main surface of first core portion 31. Second leg portion 32b may have a length equal to the lengths of first leg portion 32a and third leg portion 32c or a length smaller than the lengths of first leg portion 32a and third leg portion 32c.

Coil 38 is disposed on first main surface 22 of substrate 21. Coil 38 may have a thin-film-shaped coil pattern. Coil 38 may be, for example, a thin conductor layer having a thickness of 100 µm. Coil 38 may be a winding. A part of coil 38 may be sandwiched between first core portion 31 and second core portion 32. Coil 38 is made of a material having an electric resistivity lower than that of substrate 21 and a thermal resistivity lower than that of substrate 21. Coil 38 may be made of a metal such as copper (Cu), gold (Au), copper (Cu) alloy, nickel (Ni) alloy, gold (Au) alloy, or silver (Ag) alloy.

Coil 38 surrounds at least a part of core 30. Particularly, coil 38 may surround the penetration portion (second leg portion 32b) of core 30. Coil 38 surrounding at least a part of core 30 means that coil 38 is wound around at least a part of core 30 a half turn or more. In the present embodiment, coil 38 is wound around the penetration portion (second leg portion 32b) of core 30 about one turn.

First heat transfer member 40 may be in surface contact with core 30. Particularly, first heat transfer member 40 may be in surface contact with top portion 33 of core 30. First heat transfer member 40 may be in contact with core 30 in an area of 5% or more, preferably 20% or more, more preferably 50% or more of the area of the surface of core 30 (top portion 33 of core 30) facing first heat transfer member 40. First heat transfer member 40 may be in contact with the entire surface of core 30 (top portion 33 of core 30) facing first heat transfer member 40. First heat transfer member 40 may be in surface contact with top portion 33 of core 30 in an area larger than the smallest sectional area of the sectional areas of first leg portion 32a, second leg portion 32b, and third leg portion 32c of second core portion 32. The sectional areas of first leg portion 32a, second leg portion 32b, and third leg portion 32c are defined as sectional areas in a plane parallel to the plane in which first core portion 31 and second core portion 32 are in contact with each other.

First heat transfer member 40 may be made of a metal such as copper (Cu), aluminum (Al), iron (Fe), iron (Fe) alloy such as SUS304, copper (Cu) alloy such as phosphor bronze, or aluminum (Al) alloy such as ADC12. First heat transfer member 40 may be made of a resin material containing thermally conductive fillers, such as polyphenylene sulfide (PPS) or polyether ether ketone (PEEK). First heat transfer member 40 may have a thermal conductivity of 0.1 W/(m·K) or more, preferably 1.0 W/(m·K) or more, more preferably 10.0 W/(m·K) or more. First heat transfer member 40 may be rigid or flexible.

First heat transfer member 40 may press core 30. Particularly, first heat transfer member 40 may press second core portion 32 toward first core portion 31. First heat transfer member 40 may press core 30 when first heat transfer member 40 is fixed to first support strut 42. First heat transfer member 40 may press core 30 when first heat transfer member 40 is fixed to second support strut 52. First heat transfer member 40 may press core 30 toward first heat dissipation member 29. First heat transfer member 40 can accordingly position core 30 with respect to first heat dissipation member 29.

First support strut 42 may thermally and mechanically connect first heat transfer member 40 to first heat dissipation member 29. First heat transfer member 40 may be fixed to first support strut 42 with a first fixing member 43 such as a screw or rivet. First heat transfer member 40 may be fixed to first support strut 42 without first fixing member 43 by a method such as bonding, welding, or caulking. First support strut 42 may pass through through-hole 27 of substrate 21 to be fixed to first heat dissipation member 29. First support strut 42 may support substrate 21. First support strut 42 may be a member separate from first heat dissipation member 29 or may be integrated with first heat dissipation member 29.

First support strut 42 may be made of metal. First support strut 42 may have a thermal conductivity greater than that of substrate 21. First support strut 42 may have a thermal conductivity of 0.1 W/(m·K) or more, preferably 1.0 W/(m·K) or more, more preferably 10.0 W/(m·K) or more.

First support strut 42 may have a thermal resistance lower than that of first heat transfer member 40. The sectional area of first support strut 42 in a plane orthogonal to the longitudinal direction of first support strut 42 may be larger than the sectional area of first heat transfer member 40 in a plane orthogonal to the longitudinal direction of first heat transfer member 40.

Second support strut 52 may thermally and mechanically connect first heat transfer member 40 to first heat dissipation member 29. First heat transfer member 40 may be fixed to second support strut 52 with a second fixing member 53 such as a screw or rivet. First heat transfer member 40 may be fixed to second support strut 52 without second fixing member 53 by a method such as bonding, welding, or caulking. Second support strut 52 may pass through through-hole 28 of substrate 21 to be fixed to first heat dissipation member 29. Second support strut 52 may support substrate 21.

Second support strut 52 may be a member separate from first heat dissipation member 29 or may be integrated with first heat dissipation member 29. Second support strut 52 may be made of metal. Second support strut 52 may have a thermal conductivity greater than that of substrate 21. Second support strut 52 may have a thermal conductivity of 0.1 W/(m·K) or more, preferably 1.0 W/(m·K) or more, more preferably 10.0 W/(m·K) or more. Second support strut 52 may have a thermal resistance lower than that of first heat transfer member 40. The sectional area of second support strut 52 in a plane orthogonal to the longitudinal direction of second support strut 52 may be larger than the sectional area of first heat transfer member 40 in a plane orthogonal to the longitudinal direction of first heat transfer member 40. Any one of first support strut 42 and second support strut 52 may be omitted.

First support strut 42 may be disposed around core 30. First support strut 42 can shield a magnetic flux leaking from coil 38. First support strut 42 can accordingly prevent or reduce a leak of electromagnetic noise to another electronic component. Second support strut 52 may be disposed around core 30. Second support strut 52 can shield a magnetic flux leaking from coil 38. Second support strut 52 can accordingly prevent or reduce a leak of electromagnetic noise to another electronic component.

First support strut 42 and second support strut 52 are disposed around core 30. First support strut 42 and second support strut 52 can accordingly prevent or reduce a displacement of core 30 in a plane substantially parallel to first main surface 22 of substrate 21 which is caused by a vibration or an impact applied to circuit device 20. First support strut 42 and second support strut 52 can prevent or reduce a displacement of core 30 in a plane substantially parallel to a plane in which first core portion 31 and second core portion 32 are in contact with each other, which is caused by a vibration or an impact applied to circuit device 20. First support strut 42 and second support strut 52 can prevent or reduce a displacement of core 30 in a plane across the direction in which first support strut 42 extends and the direction in which second support strut 52 extends, which is caused by a vibration or an impact applied to circuit device 20.

First support strut 42 and second support strut 52 may be shaped into a polygonal prism such as a triangular prism or quadratic prism or may be shaped into a circular cylinder or an elliptic cylinder. The cross section of first support strut 42 perpendicular to the direction in which first support strut 42 extends may have a complex shape such as an L shape. The cross section of second support strut 52 perpendicular to the direction in which second support strut 52 extends may have a complex shape such as an L shape. First support strut 42 and second support strut 52 that have a complex shape can increase a surface that contacts core 30 when core 30 is displaced along first main surface 22 of substrate 21 due to a vibration or impact applied to circuit device 20. First support strut 42 and second support strut 52 having a complex shape can accordingly further reduce or prevent a displacement of core 30 which is caused by a vibration or an impact applied to circuit device 20.

First heat transfer member 40 may be thermally connected to first heat dissipation member 29. Particularly, first heat transfer member 40 may be thermally and mechanically connected to first heat dissipation member 29 by first support strut 42 and second support strut 52. First heat dissipation member 29 may be a part of a housing of power converter 1 which houses core 30, coil 38, and first heat transfer member 40. First heat dissipation member 29 may be a support member supporting core 30. First heat dissipation member 29 may be in surface contact with bottom portion 34 of core 30. The heat generated in core 30 can thus be transferred to first heat dissipation member 29 with a low thermal resistance. First heat dissipation member 29 may be a heat sink.

First heat dissipation member 29 may be made of a metal material such as iron (Fe), aluminum (Al), iron (Fe) alloy, or aluminum (Al) alloy. First heat dissipation member 29 may have a thermal conductivity of 0.1 W/(m·K) or more, preferably 1.0 W/(m·K) or more, more preferably 10.0 W/(m·K) or more. First heat dissipation member 29 may be made of a high thermal conductive material such as aluminum (Al) or aluminum (Al) alloy. First heat dissipation member 29 may be grounded.

The effects of circuit device 20 and power converter 1 of the present embodiment will be described.

Circuit device 20 and power converter 1 of the present embodiment include core 30, coil 38 surrounding at least a part of core 30, and first heat transfer member 40 being in surface contact with core 30. First heat transfer member 40 is thus in contact with core 30 in a larger area, which can reduce the thermal resistance between first heat transfer member 40 and core 30. The heat generated in core 30 during the operation of circuit device 20 and power converter 1 can be dissipated with a lower thermal resistance to first heat transfer member 40 being in surface contact with core 30. Circuit device 20 and power converter 1 of the present embodiment can prevent or reduce a temperature rise of core 30.

Circuit device 20 and power converter 1 of the present embodiment may further include first heat dissipation member 29 thermally connected to first heat transfer member 40. The heat generated in core 30 during the operation of circuit device 20 and power converter 1 can be transferred to first heat dissipation member 29 with a lower thermal resistance via first heat transfer member 40 being in surface contact with core 30. Circuit device 20 and power converter 1 of the present embodiment can prevent or reduce a temperature rise of core 30.

In circuit device 20 and power converter 1 of the present embodiment, first heat transfer member 40 may press core 30. This allows first heat transfer member 40 to be reliably in contact with core 30 in a larger area. Circuit device 20 and power converter 1 of the present embodiment can prevent or reduce a temperature rise of core 30 more reliably, and also, first heat transfer member 40 can position core 30 with respect to first heat dissipation member 29.

In circuit device 20 and power converter 1 of the present embodiment, top portion 33 of core 30 may be in surface contact with first heat transfer member 40, and bottom portion 34 of core 30 may be in surface contact with first heat dissipation member 29. First heat transfer member 40 is in surface contact with top portion 33 of core 30. First heat transfer member 40 is thus in contact with top portion 33 of core 30 in a larger area, which can reduce the thermal resistance between first heat transfer member 40 and core 30. First heat dissipation member 29 is in surface contact with bottom portion 34 of core 30. First heat dissipation member 29 is in contact with bottom portion 34 of core 30 in a larger area, which can reduce the thermal resistance between first heat dissipation member 29 and bottom portion 34 of core 30. The heat generated in core 30 during the operation of circuit device 20 and power converter 1 can be transferred to first heat dissipation member 29 with a lower thermal resistance via top portion 33 of core 30, first heat transfer member 40, and bottom portion 34 of core 30. Circuit device 20 and power converter 1 of the present embodiment can further reduce or prevent a temperature rise of core 30.

Circuit device 20 and power converter 1 of the present embodiment may include first support strut 42 thermally and mechanically connecting first heat transfer member 40 to first heat dissipation member 29. The heat generated in core 30 during the operation of circuit device 20 and power converter 1 can be transferred to first heat dissipation member 29 with a lower thermal resistance via first heat transfer member 40 and first support strut 42. The heat generated in core 30 during the operation of circuit device 20 and power converter 1 can also be dissipated to the surrounding atmosphere from the surface of first support strut 42. Thus, circuit device 20 and power converter 1 of the present embodiment can further reduce or prevent a temperature rise of core 30.

Circuit device 20 and power converter 1 of the present embodiment may further include second support strut 52 thermally and mechanically connecting first heat transfer member 40 to first heat dissipation member 29. The heat generated in core 30 during the operation of circuit device 20 and power converter 1 can be transferred to first heat dissipation member 29 with a lower thermal resistance via first heat transfer member 40, first support strut 42, and second support strut 52. The heat generated in core 30 during the operation of circuit device 20 and power converter 1 can also be dissipated to the surrounding atmosphere from the surface of second support strut 52 in addition to the surface of first support strut 42. Circuit device 20 and power converter 1 of the present embodiment can further reduce or prevent a temperature rise of core 30.

Embodiment 2

Figure 5:
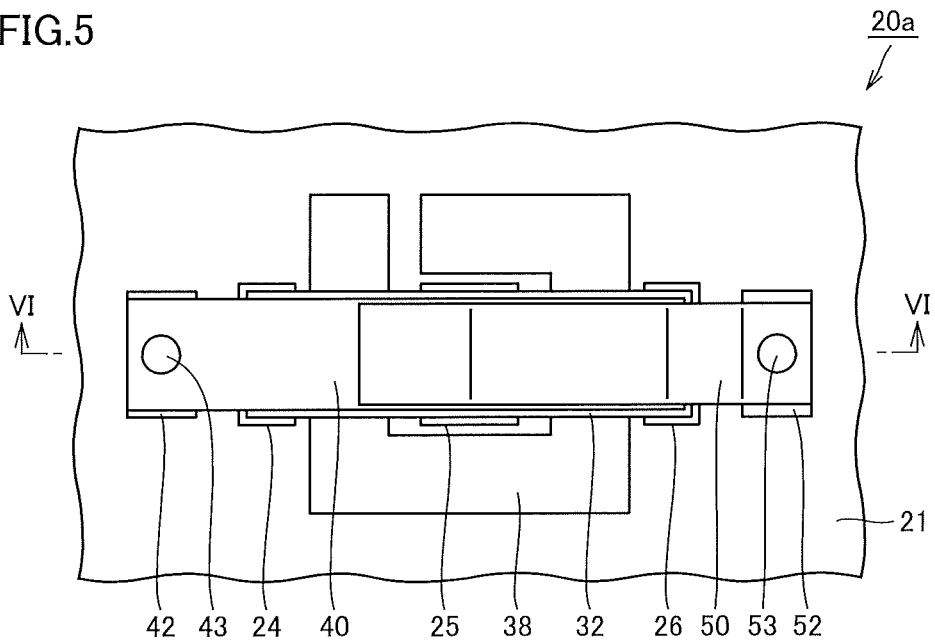
FIG. 5 is a schematic plan view of a circuit device according to Embodiment 2 of the present invention.
Figure 6:
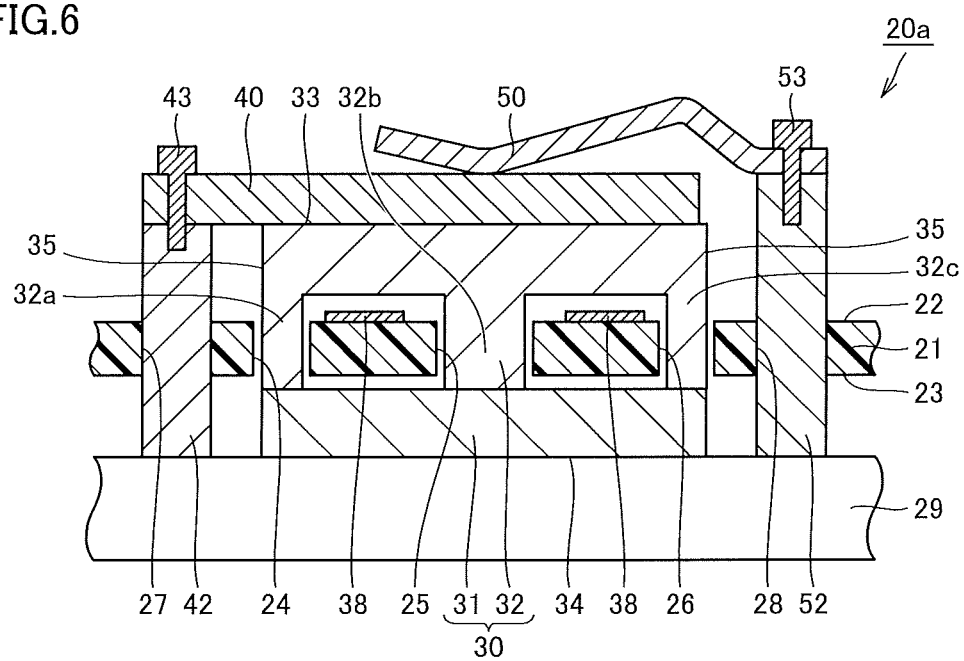
FIG. 6 is a schematic sectional view of the circuit device according to Embodiment 2 of the present invention, which is taken along section line VI-VI shown in FIG. 5.

A circuit device 20a according to Embodiment 2 will be described with reference to FIGS. 5 and 6. Circuit device 20a of the present embodiment includes components similar to those of circuit device 20 but differs from circuit device 20 mainly in the following respects.

Circuit device 20a of the present embodiment includes an elastic member 50. Elastic member 50 may be a plate spring having a bent portion. Elastic member 50 presses first heat transfer member 40 toward core 30. Elastic member 50 may press first heat transfer member 40 and core 30 toward first heat dissipation member 29. Elastic member 50 may be in line contact with first heat transfer member 40. Specifically, elastic member 50 may be in line contact with first heat transfer member 40 at the bent portion.

Elastic member 50 is attached to second support strut 52 while being deformed so as to generate a force for pressing first heat transfer member 40 toward core 30. Elastic member 50 may be fixed to second support strut 52 with second fixing member 53 such as a screw or rivet. Elastic member 50 may be attached to second support strut 52 without second fixing member 53 by a method such as bonding, welding, or caulking. Elastic member 50 may be made of iron (Fe) alloy such as SUS304, copper (Cu) alloy such as phosphor bronze, or rubber material such as urethane or silicone. Elastic member 50 may be a second heat transfer member having a thermal conductivity of 0.1 W/(m·K) or more, preferably 1.0 W/(m·K) or more, more preferably 10.0 W/(m·K) or more.

First heat transfer member 40 is fixed to first support strut 42 but is not fixed to second support strut 52. First heat transfer member 40 may have a thermal resistance lower than that of elastic member 50. The sectional area of first heat transfer member 40 in a plane orthogonal to the longitudinal direction of first heat transfer member 40 may be larger than the sectional area of elastic member 50 in a plane orthogonal to the longitudinal direction of elastic member 50. The sectional area of first heat transfer member 40 may be two or more times, preferably five or more times, more preferably 10 or more times the sectional area of elastic member 50.

First support strut 42 and second support strut 52 may have a thermal resistance lower than that of elastic member 50. The sectional area of first support strut 42 in a plane orthogonal to the longitudinal direction of first support strut 42 may be larger than the sectional area of elastic member 50 in a plane orthogonal to the longitudinal direction of elastic member 50. The sectional area of first support strut 42 may be two or more times, preferably five or more times, more preferably ten or more times the sectional area of elastic member 50. The sectional area of second support strut 52 in a plane orthogonal to the longitudinal direction of second support strut 52 may be larger than the sectional area of elastic member 50 in a plane orthogonal to the longitudinal direction of elastic member 50. The sectional area of second support strut 52 may be two or more times, preferably five or more times, more preferably ten or more times the sectional area of elastic member 50.

The effects of circuit device 20a of the present embodiment will be described. Circuit device 20a of the present embodiment achieves effects similar to those of circuit device 20 of Embodiment 1 but differs from circuit device 20 mainly in the following respects.

Circuit device 20a of the present embodiment may include elastic member 50 that presses first heat transfer member 40 toward core 30. Elastic member 50 allows first heat transfer member 40 to be reliably in contact with core 30 in a large area. Circuit device 20a of the present embodiment can prevent or reduce a temperature rise of core 30 more reliably.

Circuit device 20a of the present embodiment may include elastic member 50 that presses first heat transfer member 40 and core 30 toward first heat dissipation member 29. Core 30 is pressed against and fixed to first heat dissipation member 29 by elastic member 50. This can prevent core 30 from being displaced or damaged when an impact or a vibration is applied to circuit device 20a.

In circuit device 20a of the present embodiment, elastic member 50 may be a second heat transfer member. Elastic member 50 may be thermally connected to first heat dissipation member 29. The heat generated in core 30 during the operation of circuit device 20a can be transferred to first heat dissipation member 29 via elastic member 50 that is the second heat transfer member in addition to first heat transfer member 40. Circuit device 20a of the present embodiment can further reduce or prevent a temperature rise of core 30.

Circuit device 20a of the present embodiment may include first support strut 42 and second support strut 52. First support strut 42 may thermally and mechanically connect first heat transfer member 40 to first heat dissipation member 29. Second support strut 52 may thermally and mechanically connect elastic member 50 to first heat dissipation member 29. The heat generated in core 30 during the operation of circuit device 20a can be transferred to first heat dissipation member 29 via elastic member 50 and second support strut 52, in addition to first heat transfer member 40 and first support strut 42. Circuit device 20a of the present embodiment can further reduce or prevent a temperature rise of core 30.

Embodiment 3

Figure 7:
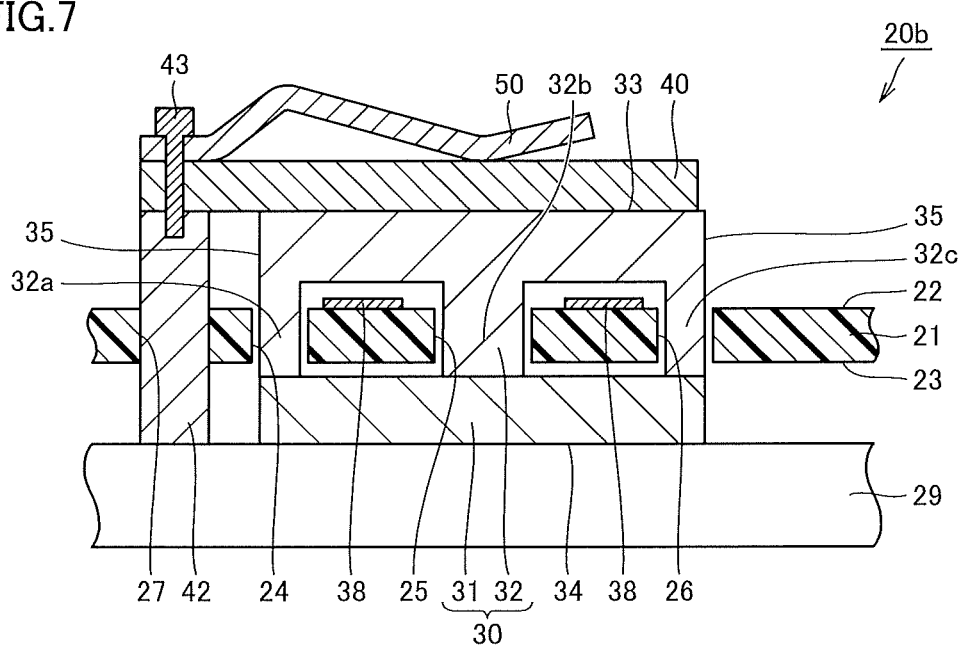
FIG. 7 is a schematic sectional view of a circuit device according to Embodiment 3 of the present invention.

A circuit device 20b according to Embodiment 3 will be described with reference to FIG. 7. Circuit device 20b of the present embodiment includes similar components and achieves similar effects to those of circuit device 20a of Embodiment 2 but differs from circuit device 20a mainly in the following respects.

Circuit device 20b of the present embodiment includes first support strut 42 thermally and mechanically connecting first heat transfer member 40 to first heat dissipation member 29. Elastic member 50 is thermally and mechanically connected to first support strut 42. Elastic member 50 as well as first heat transfer member 40 is attached to first support strut 42. In circuit device 20b of the present embodiment, second support strut 52, second fixing member 53, and through-hole 28 of circuit device 20a of Embodiment 2 can thus be omitted. Circuit device 20b of the present embodiment can reduce the number of components of circuit device 20b and also miniaturize circuit device 20b.

Embodiment 4

Figure 8:
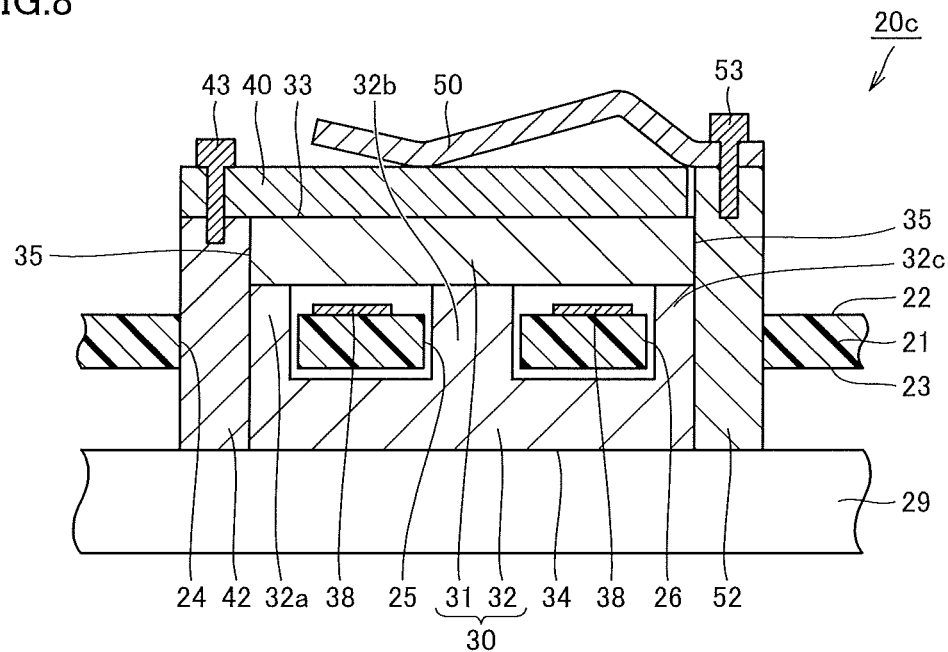
FIG. 8 is a schematic sectional view of a circuit device according to Embodiment 4 of the present invention.

A circuit device 20c according to Embodiment 4 will be described with reference to FIG. 8. Circuit device 20c of the present embodiment includes similar components and achieves similar effects to those of circuit device 20a of Embodiment 2 but differs from circuit device 20a mainly in the following respects.

In circuit device 20c of the present embodiment, second core portion 32 having an E shape is placed on first heat dissipation member 29, and first core portion 31 having an I shape is disposed on second core portion 32. Through-hole 24 receives first support strut 42 in addition to first leg portion 32a of second core portion 32. Through-hole 26 receives second support strut 52 in addition to third leg portion 32c of second core portion 32. Substrate 21 does not have through-holes 27 or 28. First support strut 42 and second support strut 52 position core 30. Particularly, first support strut 42 and second support strut 52 may position core 30 while being in contact with lateral portion 35 of core 30. First support strut 42 and second support strut 52 may be in contact with first core portion 31, in lateral portion 35 of core 30. First support strut 42 and second support strut 52 may be in contact with second core portion 32, in lateral portion 35 of core 30.

First support strut 42 and second support strut 52 can position core 30 (e.g., first core portion 31) in a plane in which core 30 and first heat transfer member 40 are in contact with each other. First support strut 42 and second support strut 52 can position core 30 (e.g., first core portion 31) in a plane orthogonal to the direction in which first support strut 42 extends and the direction in which second support strut 52 extends. First support strut 42 and second support strut 52 can position core 30 (e.g., first core portion 31) in a plane substantially parallel to first main surface 22 of substrate 21. First support strut 42 and second support strut 52 can position core 30 (e.g., first core portion 31) in a plane substantially parallel to the plane in which first core portion 31 and second core portion 32 are in contact with each other.

Circuit device 20c of the present embodiment includes first support strut 42 thermally and mechanically connecting first heat transfer member 40 to first heat dissipation member 29 and second support strut 52 thermally and mechanically connecting elastic member 50 to first heat dissipation member 29. First support strut 42 and second support strut 52 position core 30. Circuit device 20c of the present embodiment can thus position core 30 without increasing the number of components. In circuit device 20c of the present embodiment, first support strut 42 and second support strut 52 may be in contact with lateral portion 35 of core 30. The heat generated in core 30 during the operation of circuit device 20c can thus be transferred to first heat dissipation member 29 with a lower thermal resistance via first support strut 42 and second support strut 52 that are in contact with core 30.

Embodiment 5

Figure 9:
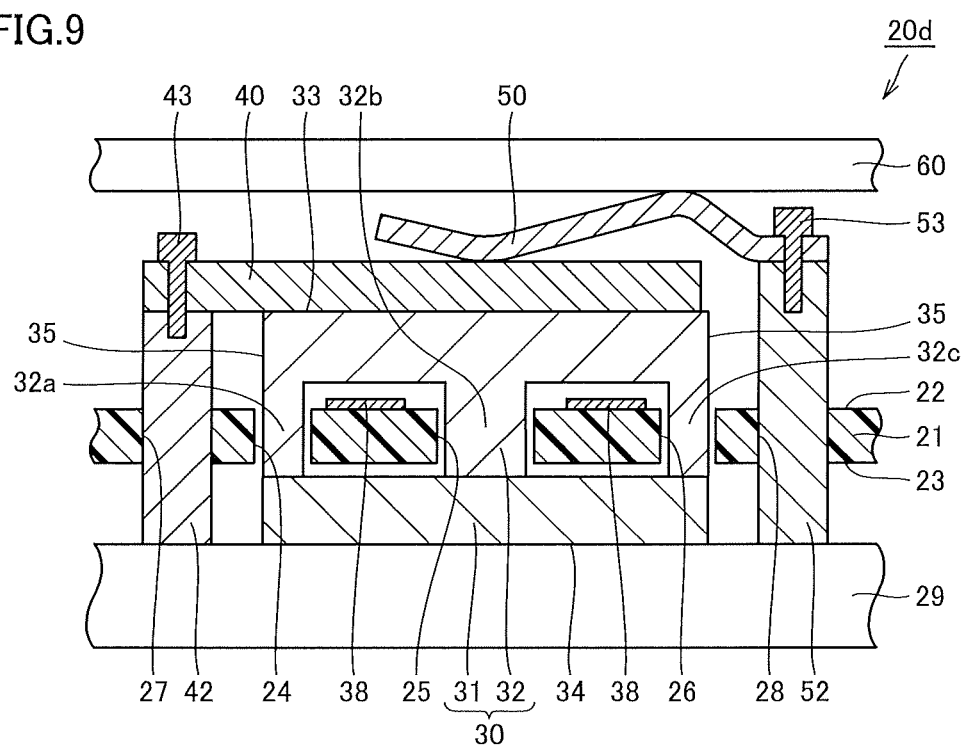
FIG. 9 is a schematic sectional view of a circuit device according to Embodiment 5 of the present invention.

A circuit device 20d according to Embodiment 5 will be described with reference to FIG. 9. Circuit device 20d of the present embodiment includes similar components and achieves similar effects to those of circuit device 20a of Embodiment 2 but differs from circuit device 20a mainly in the following respects.

Circuit device 20d of the present embodiment includes a cover 60 above top portion 33 of core 30. Cover 60 may press elastic member 50 toward core 30. Elastic member 50 is disposed between first heat transfer member 40 and cover 60. Cover 60 may be in contact with elastic member 50. Cover 60 may be in contact with a bent portion of elastic member 50. Cover 60 may be a part of the housing of power converter 1 (FIG. 1) which houses core 30, coil 38, and first heat transfer member 40. Cover 60 may be a second heat dissipation member.

Cover 60 may be made of a metal material such as copper (Cu), iron (Fe), aluminum (Al), copper (Cu) alloy, iron (Fe) alloy, or aluminum (Al) alloy. Cover 60 may have a thermal conductivity of 0.1 W/(m·K) or more, preferably 1.0 W/(m·K) or more, more preferably 10.0 W/(m·K) or more. Cover 60 may preferably be made of a high thermal conductivity material such as aluminum (Al) or aluminum (Al) alloy. Cover 60 may be supported by first support strut 42 and second support strut 52. Cover 60 may be supported by a support strut (not shown).

Circuit device 20d of the present embodiment may include cover 60 that presses elastic member 50 toward core 30. Cover 60 can increase a force by which elastic member 50 presses first heat transfer member 40. Cover 60 thus allows first heat transfer member 40 to be reliably in contact with core 30 in a large area. Circuit device 20d of the present embodiment can prevent or reduce a temperature rise of core 30 more reliably.

In circuit device 20d of the present embodiment, cover 60 presses elastic member 50 against first heat transfer member 40 by a greater force. Cover 60 thus allows elastic member 50 to be reliably in contact with first heat transfer member 40. The heat generated in core 30 during the operation of circuit device 20d may thus be transferred to first heat dissipation member 29 via elastic member 50 that is a second heat transfer member, in addition to first heat transfer member 40. Circuit device 20d of the present embodiment can further reduce or prevent a temperature rise of core 30.

In circuit device 20d of the present embodiment, cover 60 is in contact with elastic member 50, and elastic member 50 is in contact with first heat transfer member 40. The heat generated in core 30 during the operation of circuit device 20d can be transferred to cover 60 in addition to first heat dissipation member 29. Circuit device 20d of the present embodiment can further reduce or prevent a temperature rise of core 30.

In circuit device 20d of the present embodiment, cover 60 may be a second heat dissipation member. The heat generated in core 30 during the operation of circuit device 20d can be dissipated to the surrounding atmosphere from cover 60 that is the second heat dissipation member, in addition to first heat dissipation member 29. Circuit device 20d of the present embodiment can further reduce or prevent a temperature rise of core 30.

Embodiment 6

Figure 10:
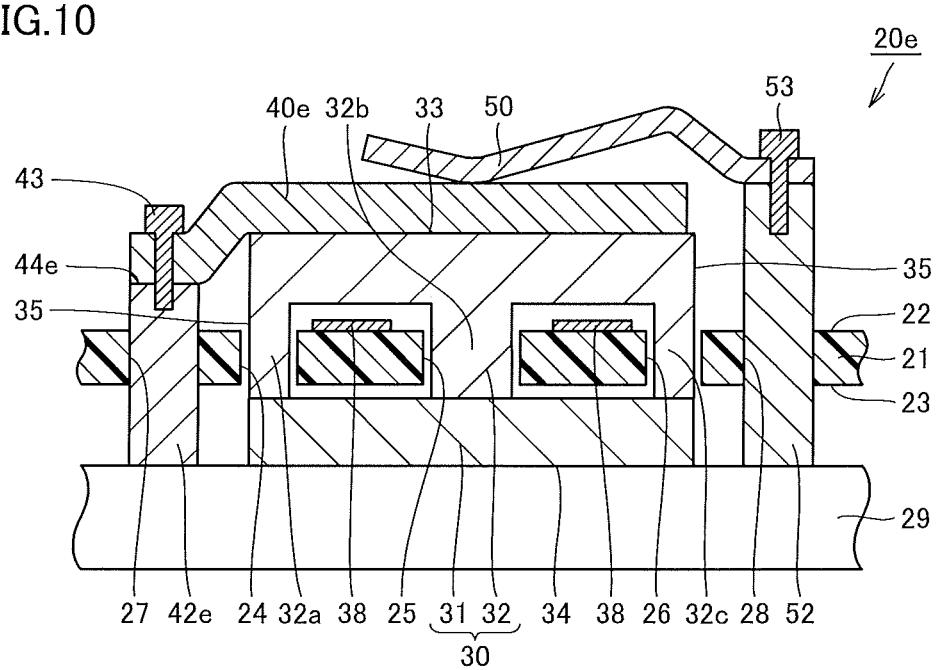
FIG. 10 is a schematic sectional view of a circuit device according to Embodiment 6 of the present invention.

A circuit device 20e according to Embodiment 6 will be described with reference to FIG. 10. Circuit device 20e of the present embodiment includes similar components and achieves similar effects to those of circuit device 20a of Embodiment 2 but differs from circuit device 20a mainly in the following respects.

In circuit device 20e of the present embodiment, a first support strut 42e has an end 44e thermally and mechanically connected to first heat transfer member 40e. End 44e of first support strut 42e is closer to first heat dissipation member 29 than top portion 33 of core 30 is to first heat dissipation member 29. First support strut 42e may be lower than top portion 33 of core 30. To smooth out a level difference between top portion 33 of core 30 and end 44e of first support strut 42e, first heat transfer member 40e may have at least one bent portion between a portion of first heat transfer member 40e which is in contact with top portion 33 of core 30 and a portion of first heat transfer member 40e which is in contact with end 44e of first support strut 42e.

In circuit device 20e of the present embodiment, end 44e of first support strut 42e is closer to first heat dissipation member 29 than top portion 33 of core 30 is to first heat dissipation member 29. The length of a dissipation path from core 30 to first heat dissipation member 29, which includes first heat transfer member 40 and first support strut 42e, is reduced, which can reduce the thermal resistance of the dissipation path. Circuit device 20e of the present embodiment can further reduce or prevent a temperature rise of core 30.

Embodiment 7

Figure 11:
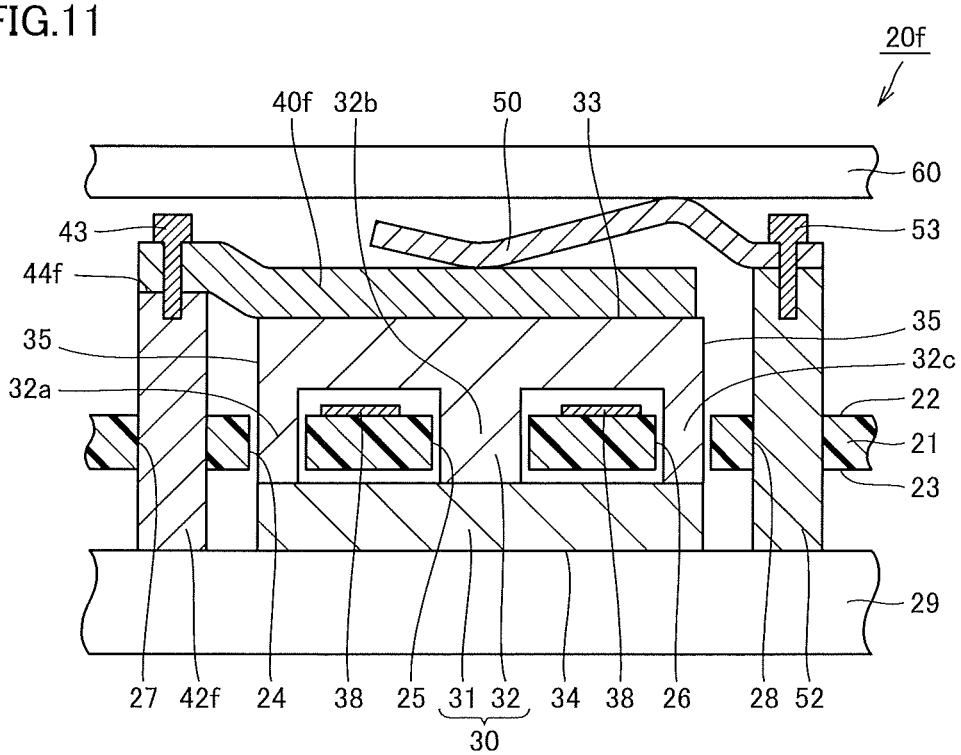
FIG. 11 is a schematic sectional view of a circuit device according to Embodiment 7 of the present invention.

A circuit device 20f according to Embodiment 7 will be described with reference to FIG. 11. Circuit device 20f of the present embodiment includes similar components and achieves similar effects to those of circuit device 20d of Embodiment 5 but differs from circuit device 20d mainly in the following respects.

In circuit device 20f of the present embodiment, a first support strut 42f has an end 44f thermally and mechanically connected to first heat transfer member 40f. End 44f of first support strut 42f is farther from first heat dissipation member 29 than top portion 33 of core 30 is from first heat dissipation member 29. First support strut 42f may be higher than top portion 33 of core 30. To smooth out a level difference between top portion 33 of core 30 and end 44f of first support strut 42f, first heat transfer member 40f may have at least one bent portion between a portion of first heat transfer member 40f which is in contact with top portion 33 of core 30 and a portion of first heat transfer member 40f which is in contact with end 44f of first support strut 42f.

In circuit device 20f of the present embodiment, end 44f of first support strut 42f is farther from first heat dissipation member 29 than top portion 33 of core 30 is from first heat dissipation member 29. First support strut 42f of the present embodiment accordingly has a surface area larger than that of first support strut 42 of Embodiment 5. The heat generated in core 30 can be dissipated to the surrounding atmosphere from a larger surface of first support strut 42. Circuit device 20f of the present embodiment can further reduce or prevent a temperature rise of core 30.

Since end 44f of first support strut 42f is farther from first heat dissipation member 29 than top portion 33 of core 30 is from first heat dissipation member 29, first support strut 42f of the present embodiment is higher than first support strut 42 of Embodiment 5. Thus, first support strut 42f of the present embodiment can accordingly shield a magnetic flux leaking from coil 38 more than first support strut 42 of Embodiment 5. Circuit device 20f of the present embodiment can further reduce or prevent an influence of electromagnetic noise on another electronic component.

In a circuit device of a modification of the present embodiment, elastic member 50 may be omitted as in circuit device 20 of Embodiment 1. In a circuit device of another modification of the present embodiment, cover 60 may be omitted. The circuit devices of the modifications of the present embodiment can reduce the number of components of the circuit devices and also miniaturize the circuit devices.

Embodiment 8

Figure 12:
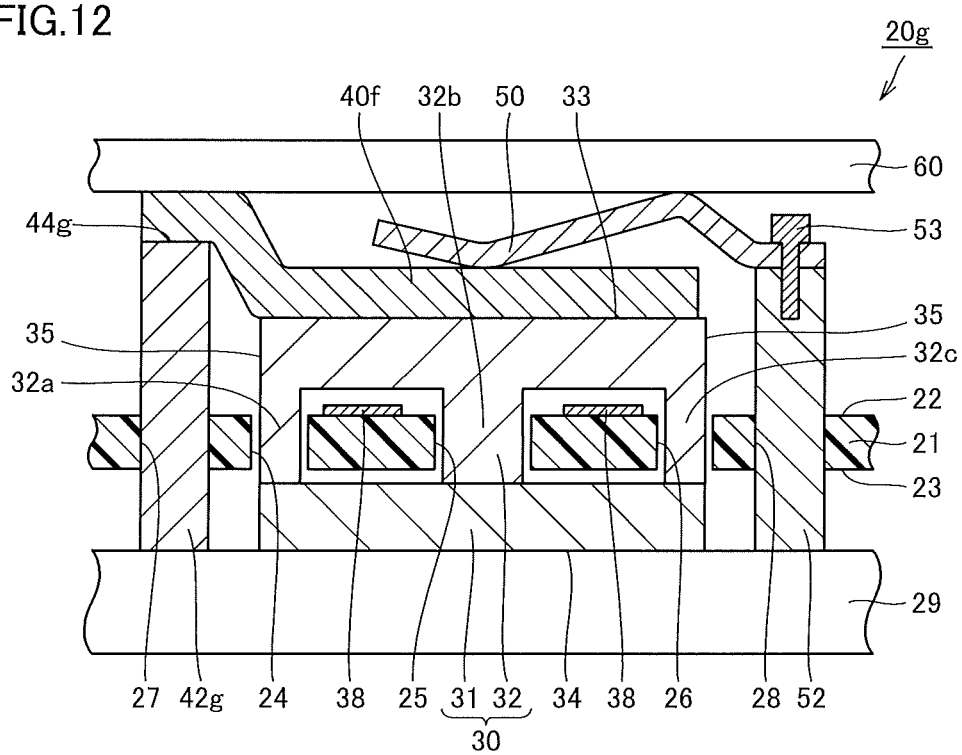
FIG. 12 is a schematic sectional view of a circuit device according to Embodiment 8 of the present invention.

A circuit device 20g according to Embodiment 8 will be described with reference to FIG. 12. Circuit device 20g of the present embodiment includes similar components and achieves similar effects to those of circuit device 20f of Embodiment 7 but differs from circuit device 20f mainly in the following respects.

In circuit device 20g of the present embodiment, first heat transfer member 40f is clamped by an end 44g of a first support strut 42g and cover 60. First heat transfer member 40f is in surface contact with cover 60. The heat generated in core 30 during the operation of circuit device 20g can thus be transferred with a low thermal resistance to cover 60 in addition to first heat dissipation member 29. Circuit device 20g of the present embodiment can further reduce or prevent a temperature rise of core 30.

In circuit device 20g of the present embodiment, since first heat transfer member 40f is clamped by end 44g of first support strut 42g and cover 60, first fixing member 43 of circuit device 20f in Embodiment 7 may be omitted. Circuit device 20g of the present embodiment can reduce the number of components of circuit device 20g.

In a circuit device of a modification of the present embodiment, elastic member 50 may be omitted as in circuit device 20 of Embodiment 1. The circuit device of the modification of the present embodiment can reduce the number of components of the circuit device and also miniaturize the circuit device.

Embodiment 9

Figure 13:
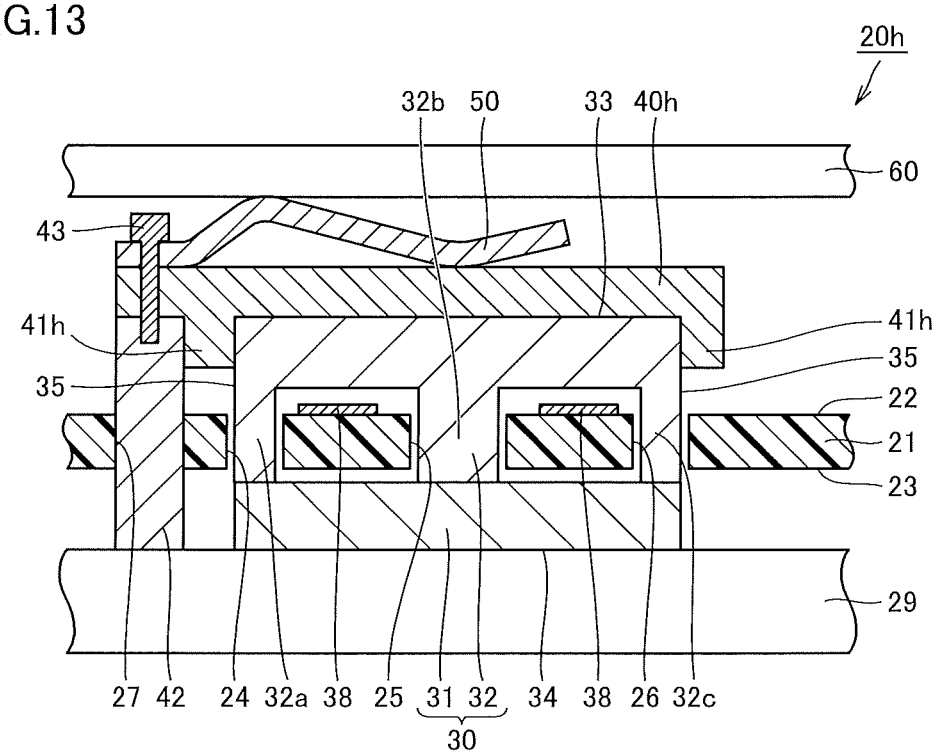
FIG. 13 is a schematic sectional view of a circuit device according to Embodiment 9 of the present invention.

A circuit device 20h according to Embodiment 9 will be described with reference to FIG. 13. Circuit device 20h of the present embodiment includes similar components and achieves similar effects to those of circuit device 20b of Embodiment 3 but differs from circuit device 20b mainly in the following respects.

Circuit device 20h of the present embodiment includes cover 60 above top portion 33 of core 30. Cover 60 presses elastic member 50 toward core 30. Cover 60 of the present embodiment includes similar components and achieves similar effects to those of cover 60 of Embodiment 5.

In circuit device 20h of the present embodiment, a first heat transfer member 40h may be in surface contact with lateral portion 35 of core 30. Particularly, first heat transfer member 40h may have a projecting portion 41h projecting toward core 30. Projection 41h of first heat transfer member 40h may be in surface contact with lateral portion 35 of core 30. First heat transfer member 40h may be formed of an elastic body. First heat transfer member 40h except for the end of first heat transfer member 40h may be formed of a rigid body, and the end of first heat transfer member 40h may be formed of an elastic body. First heat transfer member 40h may deform by being pressed by elastic member 50 to form projecting portion 41h. The material for the elastic body may be, for example, urethane or silicone. The elastic body may have a thermal conductivity of 0.1 W/(m·K) or more, preferably 1.0 W/(m·K) or more, more preferably 10.0 W/(m·K) or more.

In circuit device 20h of the present embodiment, first heat transfer member 40h is in surface contact with lateral portion 35 of core 30 in addition to top portion 33 of core 30. Since first heat transfer member 40h is in contact with core 30 in a larger area, which can reduce the thermal resistance between core 30 and first heat transfer member 40h. Circuit device 20h of the present embodiment can further reduce or prevent a temperature rise of core 30.

In circuit device 20h of the present embodiment, first heat transfer member 40h is in surface contact with lateral portion 35 of core 30 (e.g., the lateral portion of second core portion 32) in addition to top portion 33 of core 30. In the direction of the normal to the plane in which first heat transfer member 40h and lateral portion 35 of core 30 (e.g., the lateral portion of second core portion 32) are in contact with each other, core 30 (e.g., second core portion 32) can be positioned. Particularly, projecting portion 41h of first heat transfer member 40h may position core 30 (e.g., second core portion 32) in the direction of the normal to the plane in which projecting portion 41h of first heat transfer member 40h and lateral portion 35 of core 30 (e.g., the lateral portion of second core portion 32) are in contact with each other.

Figure 14:
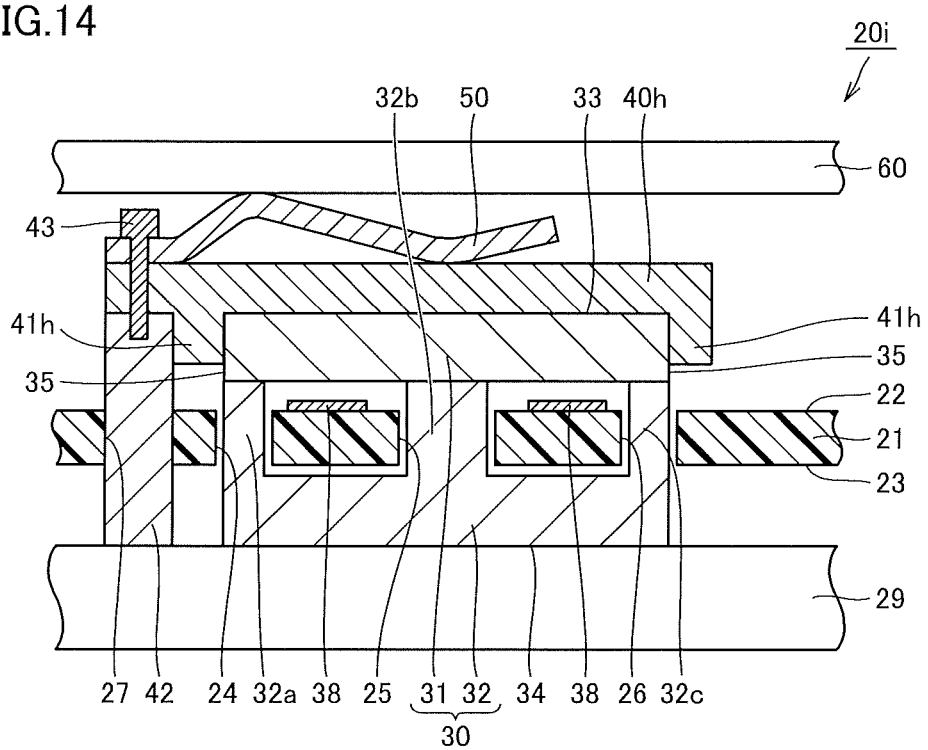
FIG. 14 is a schematic sectional view of a circuit device according to a modification of Embodiment 9 of the present invention.

A circuit device 20i according to a modification of the present embodiment will be described with reference to FIG. 14. In circuit device 20i according to the modification of the present embodiment, second core portion 32 is placed on first heat dissipation member 29, and first core portion 31 is disposed on second core portion 32. First heat transfer member 40h is in surface contact with lateral portion 35 of core 30 (e.g., the lateral portion of first core portion 31) in addition to top portion 33 of core 30. This allows first heat transfer member 40h to position core 30 (e.g., first core portion 31) in the direction of the normal to the plane in which first heat transfer member 40h and lateral portion 35 of core 30 (e.g., the lateral portion of first core portion 31) are in contact with each other. Particularly, projecting portion 41h of first heat transfer member 40h may position core 30 (e.g., first core portion 31) in the direction of the normal to the plane in which projecting portion 41h of first heat transfer member 40h and lateral portion 35 of core 30 (e.g., the lateral portion of first core portion 31) are in contact with each other.

In a circuit device of another modification of the present embodiment, cover 60 may be omitted. The circuit device of the other modification of the present embodiment can reduce the number of components of the circuit device and also miniaturize the circuit device. A circuit device of still another modification of the present embodiment may further include second support strut 52 as in Embodiment 1 shown in FIGS. 2 and 4, first heat transfer member 40h may be attached to second support strut 52 in addition to first support strut 42, and elastic member 50 may be omitted.

Embodiment 10

Figure 15:
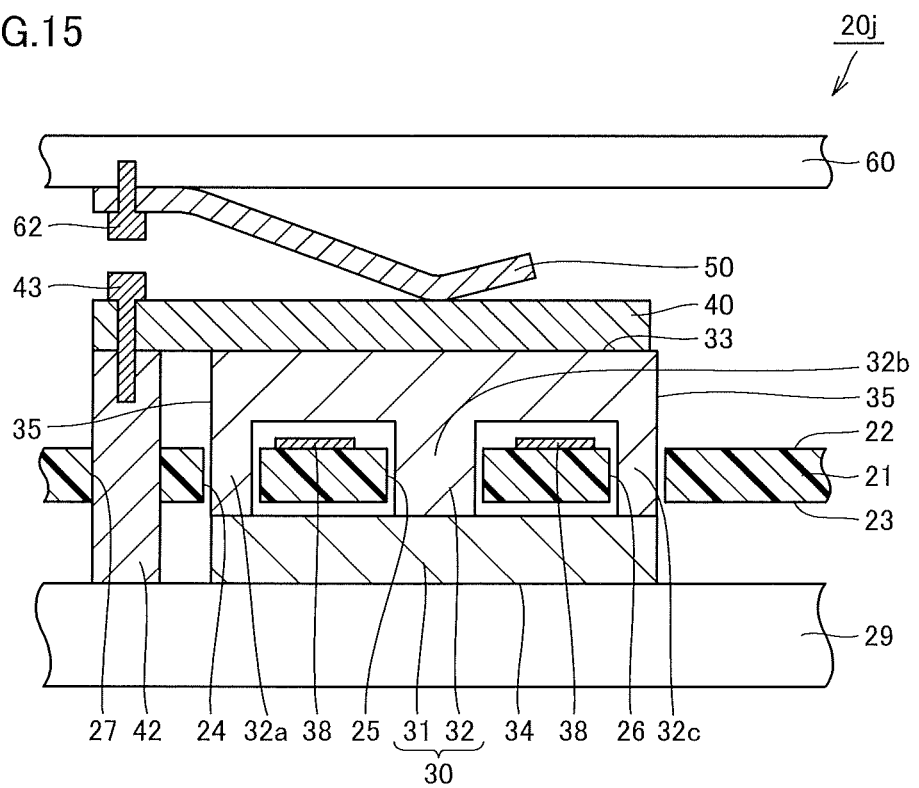
FIG. 15 is a schematic sectional view of a circuit device according to Embodiment 10 of the present invention.

A circuit device 20j according to Embodiment 10 will be described with reference to FIG. 15. Circuit device 20j of the present embodiment includes similar components and achieves similar effects to those of circuit device 20d of Embodiment 5 but differs from circuit device 20d mainly in the following respects.

In circuit device 20j of the present embodiment, elastic member 50 is attached to cover 60. Elastic member 50 presses first heat transfer member 40 toward core 30. Elastic member 50 may press first heat transfer member 40 and core 30 toward first heat dissipation member 29. Elastic member 50 may be attached to cover 60 while being deformed so as to generate a force for pressing first heat transfer member 40 toward core 30. Cover 60 may press elastic member 50 toward first heat transfer member 40 and core 30. Elastic member 50 may be attached to cover 60 with a third fixing member 62 such as a screw or rivet. Elastic member 50 may be fixed to cover 60 without third fixing member 62 by a method such as bonding, welding, or caulking.

In circuit device 20j of the present embodiment, since elastic member 50 is attached to cover 60, second support strut 52, second fixing member 53, and through-hole 28 of circuit device 20d of Embodiment 5 may be omitted. Circuit device 20j of the present embodiment can reduce the number of components of circuit device 20j and also miniaturize circuit device 20j.

Figure 16:
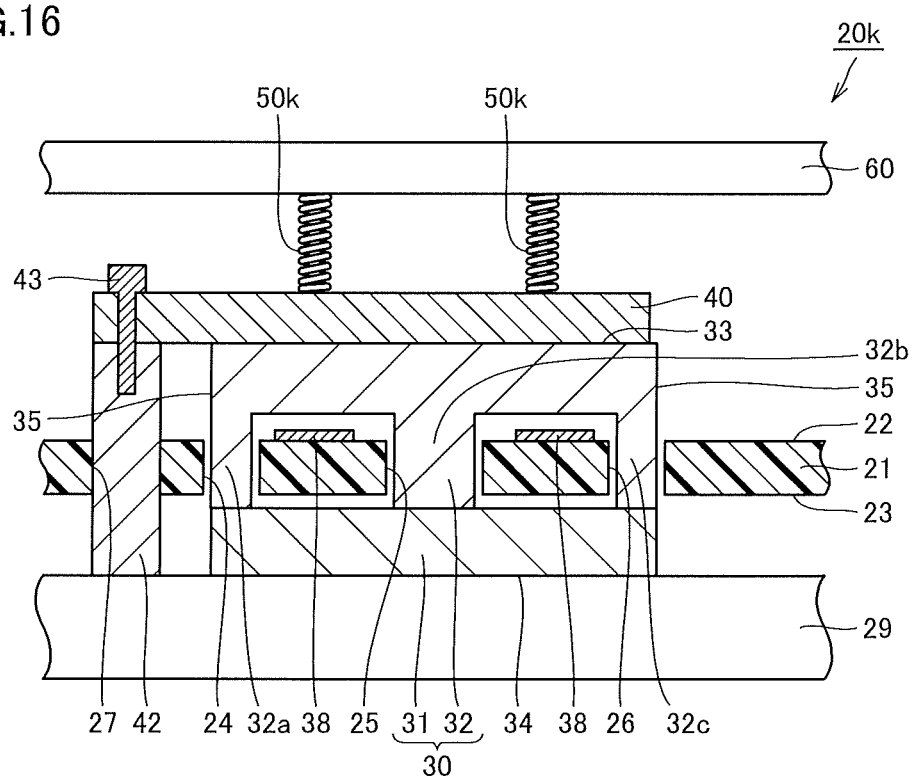
FIG. 16 is a schematic sectional view of a circuit device according to a modification of Embodiment 10 of the present invention.

A circuit device 20k according to a modification of the present embodiment will be described with reference to FIG. 16. In circuit device 20k according to the modification of the present embodiment, an elastic member 50k is a coil spring. Cover 60 may press elastic member 50k that is a coil spring toward first heat transfer member 40 and core 30. Elastic member 50k that is a coil spring may be made of, for example, iron (Fe) alloy such as SUS304 or copper (Cu) alloy such as phosphor bronze. Elastic member 50k may be attached to cover 60 by a method such as bonding, welding, or caulking. Elastic member 50k may be attached to a projection (not shown) provided to cover 60.

Circuit device 20k according to the modification of the present embodiment may include one or more elastic members 50k. With an increasing number of elastic members 50k, a load imposed on one of elastic members 50k can be reduced. The material for elastic member 50k thus may be a material having a low rigidity and a high thermal conductivity. With an increasing number of elastic members 50k, the contact area between elastic members 50k and first heat transfer member 40 increases, and the heat generated in core 30 during the operation of circuit device 20k can be transferred to cover 60 with a lower thermal resistance. With an increasing number of elastic members 50k, thus, a temperature rise of core 30 can be further reduced or prevented.

In circuit device 20k according to the modification of the present embodiment, elastic member 50k is a coil spring. This reduces the size of elastic member 50k along the plane in which first heat transfer member 40 and elastic member 50k are in contact with each other, which can miniaturize circuit device 20k. Elastic member 50k that is a coil spring is commercially available easily, which can reduce the cost of circuit device 20k.

Embodiment 11

Figure 17:
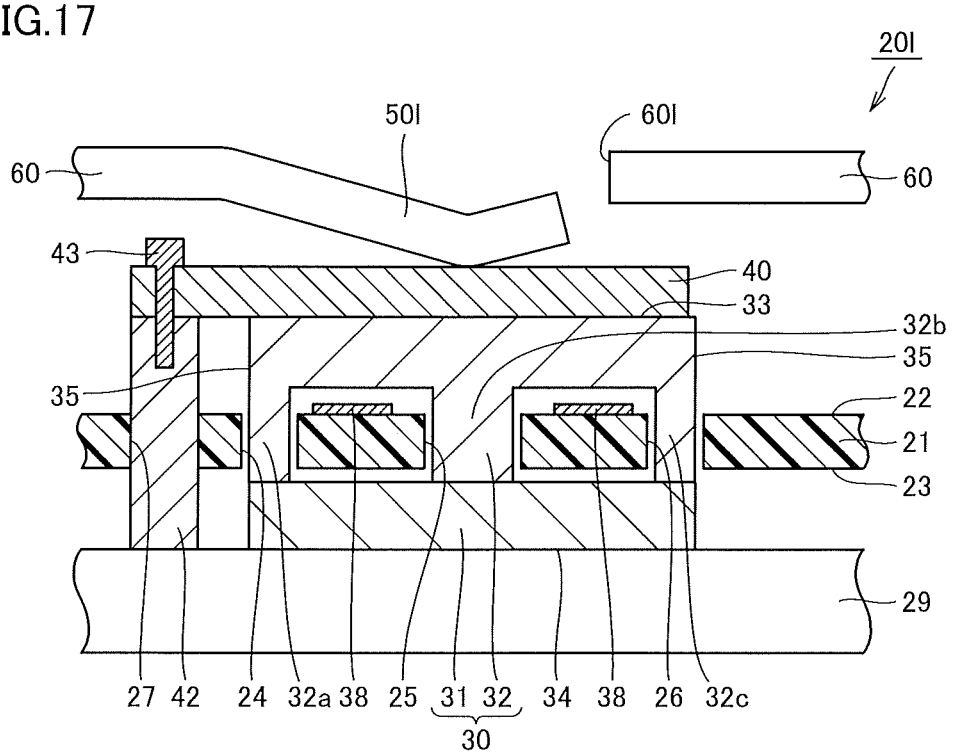
FIG. 17 is a schematic sectional view of a circuit device according to Embodiment 11 of the present invention.

A circuit device 20l according to Embodiment 11 will be described with reference to FIG. 17. Circuit device 20l of the present embodiment includes similar components and achieves similar effects to those of circuit device 20j of Embodiment 10 but differs from circuit device 20j in the following respects.

In circuit device 20l of the present embodiment, an elastic member 50l is integrated with cover 60. Elastic member 50l integrated with cover 60 may be formed by processing cover 60 by, for example, pressing. Elastic member 50l may be made of a metal material such as copper (Cu), iron (Fe), aluminum (Al), copper (Cu) alloy, iron (Fe) alloy, or aluminum (Al) alloy, similarly to cover 60. Elastic member 50l may have a thermal conductivity of 0.1 W/(m·K) or more, preferably 1.0 W/(m·K) or more, more preferably 10.0 W/(m·K) or more. Cover 60 may have an opening 60l.

In circuit device 20l of the present embodiment, since elastic member 50l is integrated with cover 60, third fixing member 62 of circuit device 20j of Embodiment 10 may be omitted. Circuit device 20l of the present embodiment can reduce the number of components of circuit device 20l and also miniaturize circuit device 20l.

In circuit device 20l of the present embodiment, cover 60 has opening 60l. The heat generated in core 30 during the operation of circuit device 20l can thus be dissipated to the outside of circuit device 20l from opening 60l. Circuit device 20l of the present embodiment can further reduce or prevent a temperature rise of core 30.

Embodiment 12

Figure 18:
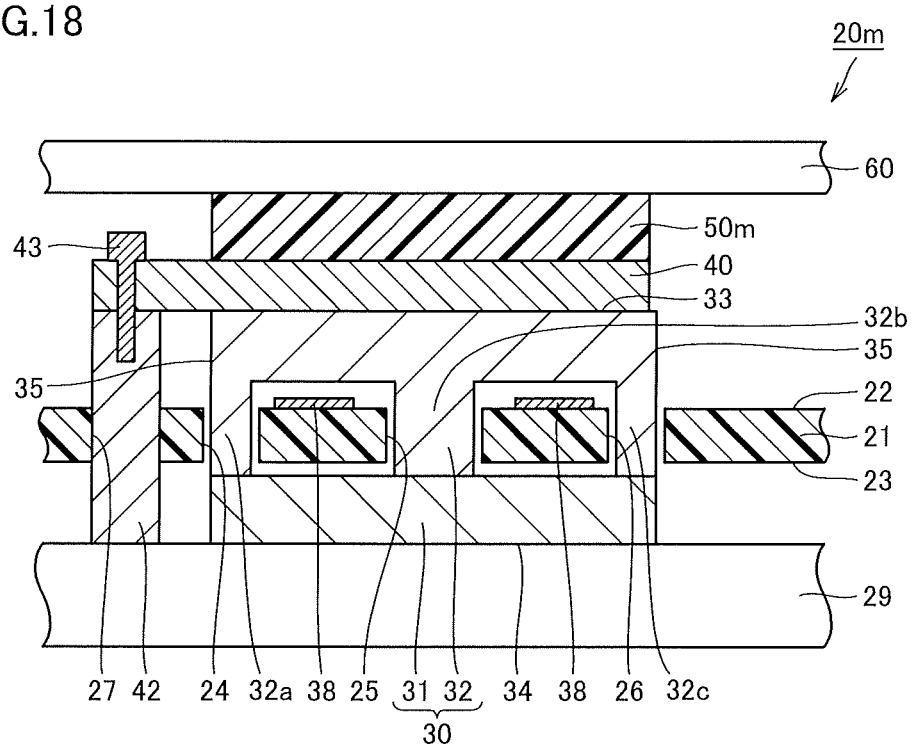
FIG. 18 is a schematic sectional view of a circuit device according to Embodiment 12 of the present invention.

A circuit device 20m according to Embodiment 12 will be described with reference to FIG. 18. Circuit device 20m of the present embodiment includes similar components and achieves similar effects to those of circuit device 20j of Embodiment 10 but differs from circuit device 20j mainly in the following respects.

In circuit device 20m according to the present embodiment, elastic member 50m may be an elastic plate. Elastic member 50m that is an elastic plate may be made of, for example, a rubber material such as urethane or silicone. Elastic member 50 may be a second heat transfer member having a thermal conductivity of 0.1 W/(m·K) or more, preferably 1.0 W/(m·K) or more, more preferably 10.0 W/(m·K) or more. Elastic member 50m may be clamped between cover 60 and first heat transfer member 40. Elastic member 50m may be thinner than first heat transfer member 40.

Elastic member 50m may be in contact with first heat transfer member 40 in an area of 5% or more, preferably 20% or more, more preferably 50% or more of the area of the surface of first heat transfer member 40 facing elastic member 50m. Elastic member 50m may be in contact with the surface of first heat transfer member 40 facing elastic member 50m in an area equal to the contact area between top portion 33 of core 30 and first heat transfer member 40. Over the entire surface of elastic member 50m facing first heat transfer member 40, elastic member 50m may be in contact with first heat transfer member 40. Elastic member 50m may be in contact with the surface of first heat transfer member 40 facing elastic member 50m in an area larger than the smallest sectional area of the sectional areas of first leg portion 32a, second leg portion 32b, and third leg portion 32c of second core portion 32. The sectional areas of first leg portion 32a, second leg portion 32b, and third leg portion 32c are defined as sectional areas in a plane parallel to the plane in which first core portion 31 and second core portion 32 are in contact with each other.

Elastic member 50m may be in surface contact with cover 60. Over the entire surface of elastic member 50m facing cover 60, elastic member 50m may be in contact with cover 60. Cover 60 may press elastic member 50m toward first heat transfer member 40 and core 30. An uneven structure (not shown) may be formed in the surface of elastic member 50m facing cover 60. The uneven structure further increases the contact area between elastic member 50m and cover 60, which can reduce the thermal resistance between elastic member 50m and first heat transfer member 40.

In circuit device 20m according to the present embodiment, elastic member 50m is an elastic plate. Elastic member 50m can press first heat transfer member 40 against core 30 at a uniform pressure over a large area. Elastic member 50m can thus reduce the thermal resistance between core 30 and first heat transfer member 40. Circuit device 20m of the present embodiment can further reduce or prevent a temperature rise of core 30.

In circuit device 20m of the present embodiment, elastic member 50m is an elastic plate. Since elastic member 50m is in contact with first heat transfer member 40 in a larger area, the thermal resistance between elastic member 50m and first heat transfer member 40m can be reduced. The heat generated in core 30 during the operation of circuit device 20m can thus be transferred with a lower thermal resistance to cover 60 in addition to first heat dissipation member 29. Circuit device 20m of the present embodiment can further reduce or prevent a temperature rise of core 30.

In circuit device 20m according to the present embodiment, elastic member 50m is clamped between cover 60 and first heat transfer member 40. In circuit device 20m of the present embodiment, third fixing member 62 of circuit device 20j in Embodiment 10 can thus be omitted. Circuit device 20m of the present embodiment can reduce the number of components of circuit device 20m and also miniaturize circuit device 20m.

Embodiment 13

Figure 19:
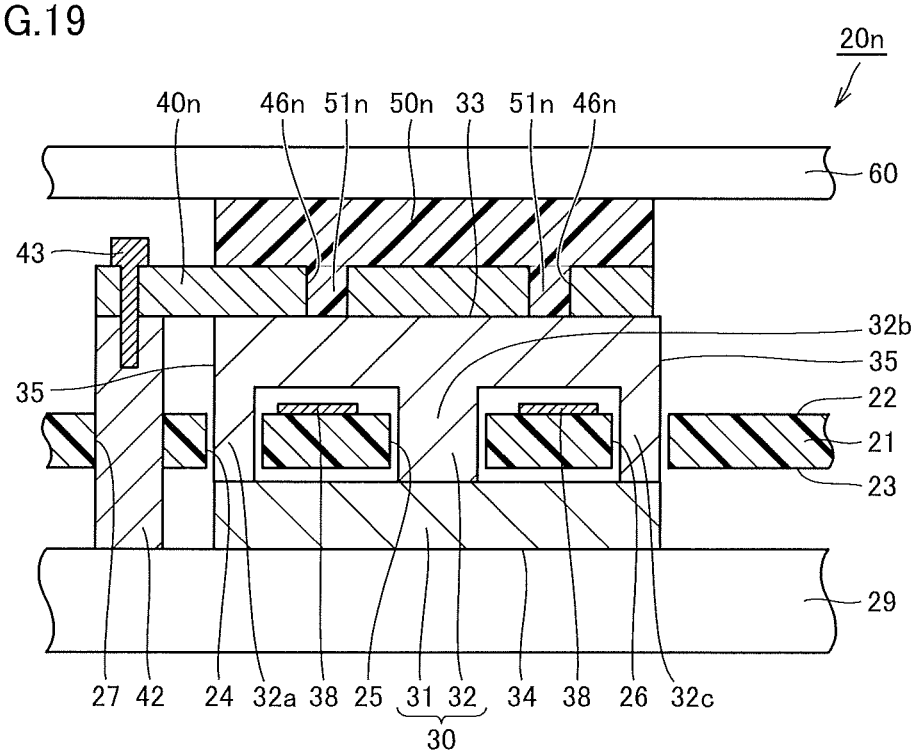
FIG. 19 is a schematic sectional view of a circuit device according to Embodiment 13 of the present invention.

A circuit device 20n according to Embodiment 13 will be described with reference to FIG. 19. Circuit device 20n of the present embodiment includes similar components and achieves similar effects to those of circuit device 20m of Embodiment 12 but differs from circuit device 20m in the following respects.

In circuit device 20n of the present embodiment, a first heat transfer member 40n has at least one of a hole 45n and a cutaway portion. Hole 45n and the cutaway portion may penetrate first heat transfer member 40n or may be a recess that does not reach the surface of first heat transfer member 40n adjacent to core 30. First heat transfer member 40n may be a rigid body.

Elastic member 50n comes into at least one of hole 45n and the cutaway portion to be in contact with first heat transfer member 40n in hole 45n and the cutaway portion. Particularly, elastic member 50n may have a projecting portion 51n projecting toward core 30. Projection 51n of elastic member 50n may be in surface contact with the surface of hole 45n of first heat transfer member 40n. Projection 51n of elastic member 50n may be in surface contact with top portion 33 of core 30. Projection 51n may be formed by the deformation of elastic member 50n which has been pressed by cover 60.

In circuit device 20n of the present embodiment, first heat transfer member 40n has at least one of hole 45n and the cutaway portion. Elastic member 50n is in contact with first heat transfer member 40n at hole 45n and the cutaway portion. Since elastic member 50n is in contact with first heat transfer member 40n in a larger area, the thermal resistance between elastic member 50n and first heat transfer member 40n can be reduced. The heat generated in core 30 during the operation of circuit device 20n can thus be transferred with a lower thermal resistance to cover 60 in addition to first heat dissipation member 29. Circuit device 20n of the present embodiment can further reduce or prevent a temperature rise of core 30.

In circuit device 20n of the present embodiment, first heat transfer member 40n has at least one of hole 45n and the cutaway portion. Elastic member 50n is in contact with first heat transfer member 40n at hole 45n and the cutaway portion. This allows projecting portion 51n to position first heat transfer member 40n in the plane in which elastic member 50n and first heat transfer member 40n are in contact with each other (except for the plane in which at least one of hole 45n and the cutaway portion of first heat transfer member 40n and projecting portion 51n of elastic member 50n are in contact with each other). Projection 51n of elastic member 50n can position first heat transfer member 40n in the direction of the normal to the plane in which at least one of hole 45n and the cutaway portion of first heat transfer member 40n and projecting portion 51n of elastic member 50n are in contact with each other.

Embodiment 14

Figure 20:
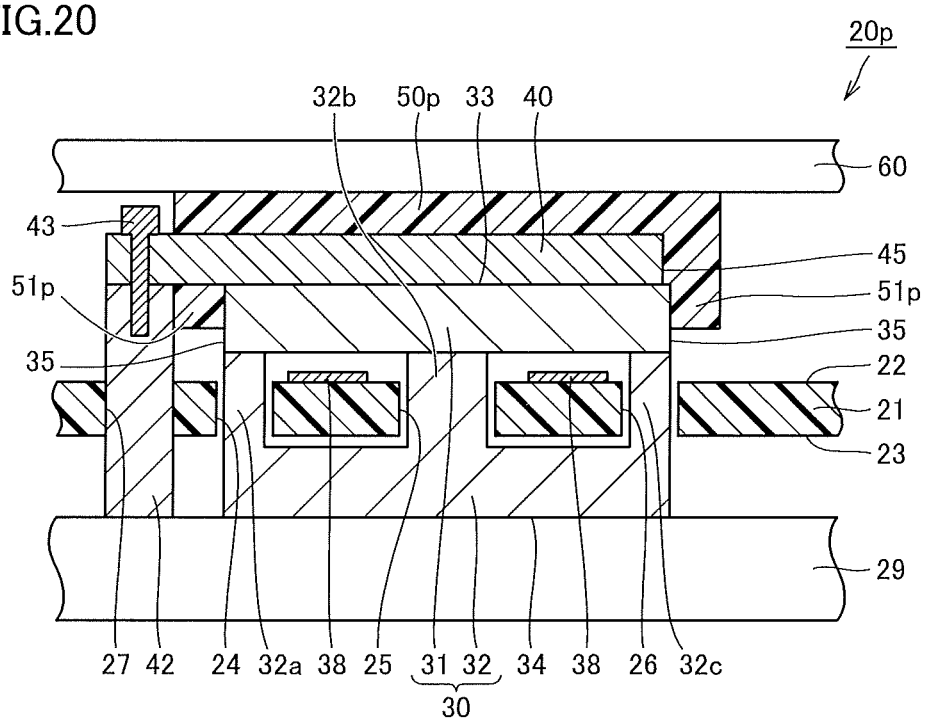
FIG. 20 is a schematic sectional view of a circuit device according to Embodiment 14 of the present invention.

A circuit device 20p according to Embodiment 14 will be described with reference to FIG. 20. Circuit device 20p of the present embodiment includes similar components and achieves similar effects to those of circuit device 20m of Embodiment 12 but differs from circuit device 20m mainly in the following respects.

In circuit device 20p of the present embodiment, second core portion 32 is placed on first heat dissipation member 29, and first core portion 31 is disposed on second core portion 32, as in circuit device 20c of Embodiment 4.

In circuit device 20p of the present embodiment, an elastic member 50p is in surface contact with lateral portion 35 of core 30. Elastic member 50p may be in surface contact with a lateral surface of first core portion 31. Elastic member 50p may be in surface contact with lateral surface 45 of first heat transfer member 40. Particularly, elastic member 50p may have a projecting portion 51p projecting toward core 30. Projection 51p of elastic member 50p may be in surface contact with lateral surface 45 of first heat transfer member 40. Projection 51p of elastic member 50p is in surface contact with lateral portion 35 of core 30. Particularly, projecting portion 51p of elastic member 50p may be in surface contact with the lateral surface of first core portion 31. Projection 51p may be formed by the deformation of elastic member 50p that has been pressed.

In circuit device 20p of the present embodiment, elastic member 50p is in surface contact with lateral portion 35 of core 30 (the lateral surface of first core portion 31). This can reduce the thermal resistance between core 30 and elastic member 50p. Circuit device 20p of the present embodiment can further reduce or prevent a temperature rise of core 30.

In circuit device 20p of the present embodiment, elastic member 50p may be in surface contact with lateral surface 45 of first heat transfer member 40. Since elastic member 50p is in contact with first heat transfer member 40 in a larger area, the thermal resistance between elastic member 50p and first heat transfer member 40 can be reduced. Circuit device 20p of the present embodiment can further reduce or prevent a temperature rise of core 30.

In circuit device 20p of the present embodiment, elastic member 50p is in surface contact with lateral portion 35 of core 30 (e.g., the lateral surface of first core portion 31). This allows elastic member 50p to position core 30 (e.g., first core portion 31) in the direction orthogonal to lateral portion 35 of core 30. Particularly, projecting portion 51p of elastic member 50p may position core 30 (e.g., first core portion 31) as described above.

In circuit device 20p of the present embodiment, elastic member 50p may be in surface contact with lateral surface 45 of first heat transfer member 40. This allows elastic member 50p to position first heat transfer member 40 in a plane in which elastic member 50p and first heat transfer member 40 are in contact with each other (except for a plane in which lateral surface 45 of first heat transfer member 40 and projecting portion 51p of elastic member 50p are in contact with each other). Projection 51p of elastic member 50p can position first heat transfer member 40 in the direction of the normal to the plane in which lateral surface 45 of first heat transfer member 40 and projecting portion 51p of elastic member 50p are in contact with each other.

Embodiment 15

Figure 21:
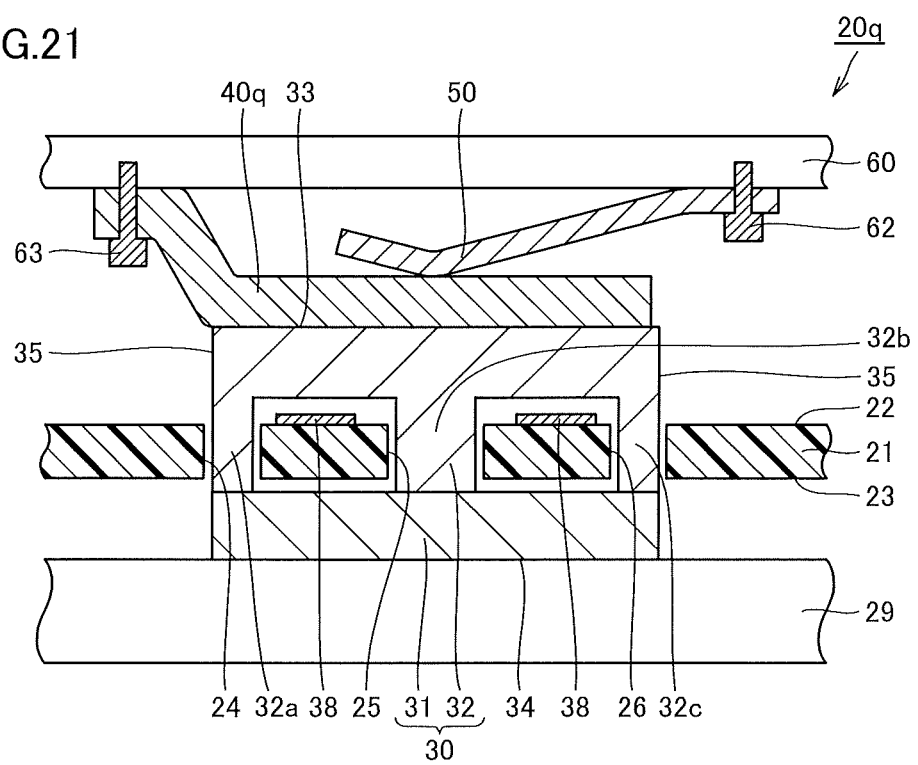
FIG. 21 is a schematic sectional view of a circuit device according to Embodiment 15 of the present invention.

A circuit device 20q according to Embodiment 15 will be described with reference to FIG. 21. Circuit device 20q of the present embodiment includes similar components and achieves similar effects to those of circuit device 20j of Embodiment 10 but differs from circuit device 20j mainly in the following respects.

In circuit device 20q of the present embodiment, elastic member 50 and a first heat transfer member 40q are attached to cover 60. Particularly, one end of first heat transfer member 40q is in surface contact with cover 60. First heat transfer member 40q may be attached to cover 60 with a fourth fixing member 63 such as a screw or rivet. First heat transfer member 40q may be fixed to cover 60 without fourth fixing member 63 by a method such as bonding, welding, or caulking. Elastic member 50 is attached to cover 60 at a position different from that of first heat transfer member 40q. One end of elastic member 50 is in surface contact with cover 60.

Elastic member 50 may be attached to cover 60 with third fixing member 62 such as a screw or rivet. Elastic member 50 may be fixed to cover 60 without third fixing member 62 by a method such as bonding, welding, or caulking Elastic member 50 presses first heat transfer member 40$q$ against core 30. Cover 60 may press first heat transfer member 40$q$ and elastic member 50 against core 30. To smooth out a level difference between top portion 33 of core 30 and cover 60, first heat transfer member 40$q$ may have at least one bent portion.

In circuit device 20$q$ of the present embodiment, since elastic member 50 and first heat transfer member 40$q$ are attached to cover 60, first support strut 42, second support strut 52, and through-holes 27 and 28 of circuit device 20$d$ of Embodiment 5 may be omitted. Circuit device 20$q$ of the present embodiment can reduce the number of components of circuit device 20$q$ and also miniaturize circuit device 20$q$.

In circuit device 20$q$ of the present embodiment, first heat transfer member 40 is in surface contact with cover 60. This can reduce the thermal resistance between first heat transfer member 40 and cover 60. Circuit device 20$q$ of the present embodiment can further reduce or prevent a temperature rise of core 30.

Figure 22:
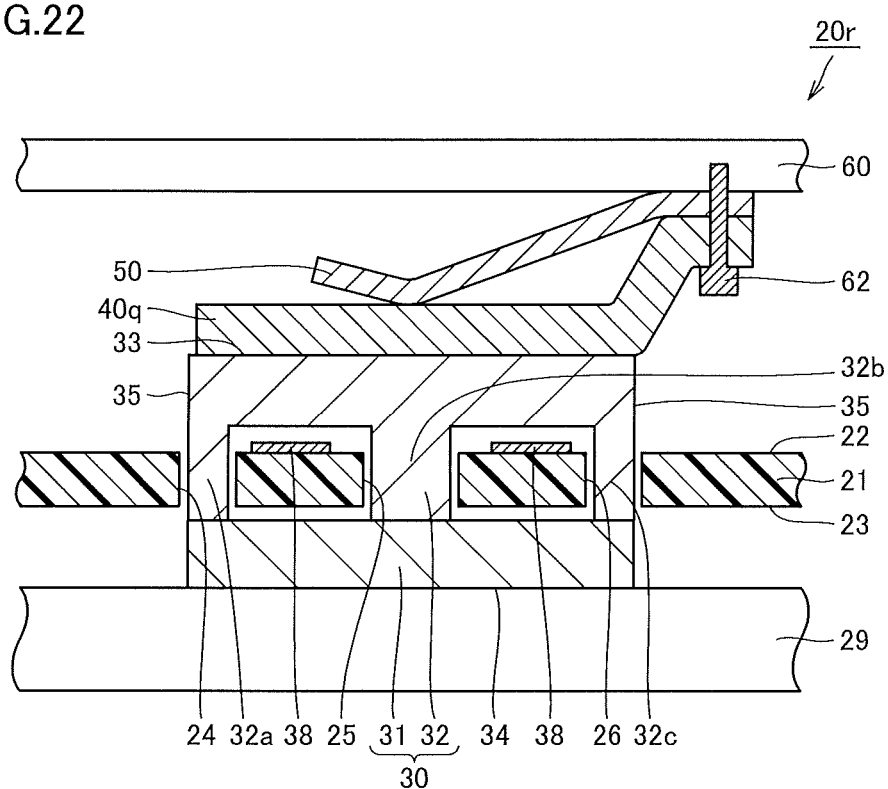
FIG. 22 is a schematic sectional view of a circuit device according to a modification of Embodiment 15 of the present invention.

A circuit device 20$r$ according to a modification of the present embodiment will be described with reference to FIG. 22. In circuit device 20$r$ according to the modification of the present embodiment, elastic member 50 and first heat transfer member 40$q$ are attached to cover 60 with third fixing member 62. In circuit device 20$r$ according to the modification of the present embodiment, fourth fixing member 63 can thus be omitted. Circuit device 20$r$ according to the modification of the present embodiment can reduce the number of components of circuit device 20$r$ and also miniaturize circuit device 20$r$.

Embodiment 16

Figure 23:
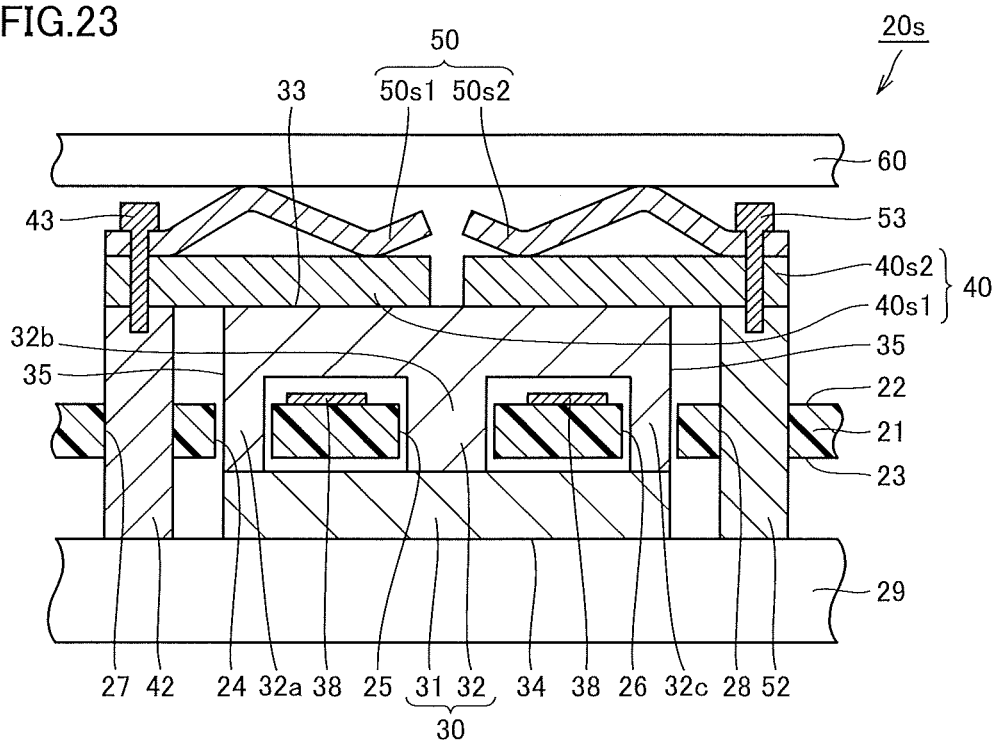
FIG. 23 is a schematic sectional view of a circuit device according to Embodiment 16 of the present invention.

A circuit device 20$s$ according to Embodiment 16 will be described with reference to FIG. 23. Circuit device 20$s$ of the present embodiment includes similar components and achieves similar effects to those of circuit device 20$d$ of Embodiment 5 but differs from circuit device 20$d$ mainly in the following respects.

In circuit device 20$s$ of the present embodiment, first heat transfer member 40 is composed of heat transfer portions 40$s$1 and 40$s$2. Each of heat transfer portions 40$s$1 and 40$s$2 is disposed on top portion 33 of core 30 to be in surface contact with top portion 33 of core 30. Heat transfer portion 40$s$1 is fixed to first support strut 42 with first fixing member 43. Heat transfer portion 40$s$1 is mechanically and thermally connected to first support strut 42. Heat transfer portion 40$s$2 is fixed to second support strut 52 with second fixing member 53. Heat transfer portion 40$s$2 is mechanically and thermally connected to second support strut 52. First heat transfer member 40 is mechanically and thermally connected to first support strut 42 and second support strut 52.

In circuit device 20$s$ of the present embodiment, elastic member 50 is composed of elastic portions 50$s$1 and 50$s$2. Elastic portion 50$s$1 is fixed to first support strut 42 with first fixing member 43. Elastic portion 50$s$1 may be attached to first support strut 42 while being deformed so as to generate a force for pressing heat transfer portion 40$s$1 toward core 30. Elastic portion 50$s$2 is fixed to second support strut 52 with second fixing member 53. Elastic portion 50$s$2 may be attached to second support strut 52 while being deformed so as to generate a force for pressing heat transfer portion 40$s$2 toward core 30.

Elastic portion 50$s$1 is in contact with heat transfer portion 40$s$1 and presses heat transfer portion 40$s$1 toward core 30. Elastic portion 50$s$2 is in contact with heat transfer portion 40$s$2 and presses heat transfer portion 40$s$2 toward core 30. Elastic portions 50$s$1 and 50$s$2 may press heat transfer portions 40$s$1 and 40$s$2 and core 30 toward first heat dissipation member 29. Cover 60 may be in contact with elastic portions 50$s$1 and 50$s$2 and press elastic portions 50$s$1 and 50$s$2 against heat transfer portions 40$s$1 and 40$s$2, respectively.

In circuit device 20$s$ of the present embodiment, elastic member 50 is in contact with a plurality of portions of first heat transfer member 40. Elastic member 50 thus allows first heat transfer member 40 to be in contact with core 30 reliably in a large area. In addition, since elastic member 50 is in contact with the plurality of portions of first heat transfer member 40, the thermal resistance between elastic member 50 and first heat transfer member 40 can be reduced. Circuit device 20$s$ of the present embodiment can prevent or reduce a temperature rise of core 30 more reliably.

In circuit device 20$s$ of the present embodiment, elastic member 50 is in contact with a plurality of portions of first heat transfer member 40. This can reduce a load imposed on one of the plurality of contact portions between elastic member 50 and first heat transfer member 40. The material for elastic member 50 may be a material having a low rigidity and a high thermal conductivity.

In circuit device 20$s$ of the present embodiment, elastic member 50 is composed of elastic portions 50$s$1 and 50$s$2. First heat transfer member 40 is composed of heat transfer portions 40$s$1 and 40$s$2. Elastic portions 50$s$1 and 50$s$2 press heat transfer portions 40$s$1 and 40$s$2, respectively, toward core 30. Each of heat transfer portions 40$s$1 and 40$s$2 of circuit device 20$s$ of the present embodiment has a smaller length and a smaller thermal resistance than those of first heat transfer member 40 of circuit device 20$d$ of Embodiment 5. Circuit device 20$s$ of the present embodiment can further reduce or prevent a temperature rise of core 30.

In circuit device 20$s$ of the present embodiment, first heat transfer member 40 is composed of heat transfer portions 40$s$1 and 40$s$2. Heat transfer portion 40$s$1 is fixed to first support strut 42, and heat transfer portion 40$s$2 is fixed to second support strut 52. The heat generated in core 30 can be transferred to first heat dissipation member 29 via second support strut in addition to first heat transfer member 40 and first support strut 42. Circuit device 20$s$ of the present embodiment increases heat dissipation paths for the heat generated in core 30, which can prevent or reduce a temperature rise of core 30.

In circuit device 20$s$ of the present embodiment, cover 60 may be in contact with a plurality portions of elastic member 50. Particularly, cover 60 may be in contact with elastic portions 50$s$1 and 50$s$2. This can reduce the thermal resistance between elastic member 50 and cover 60. Circuit device 20$s$ of the present embodiment can further reduce or prevent a temperature rise of core 30.

Figure 24:
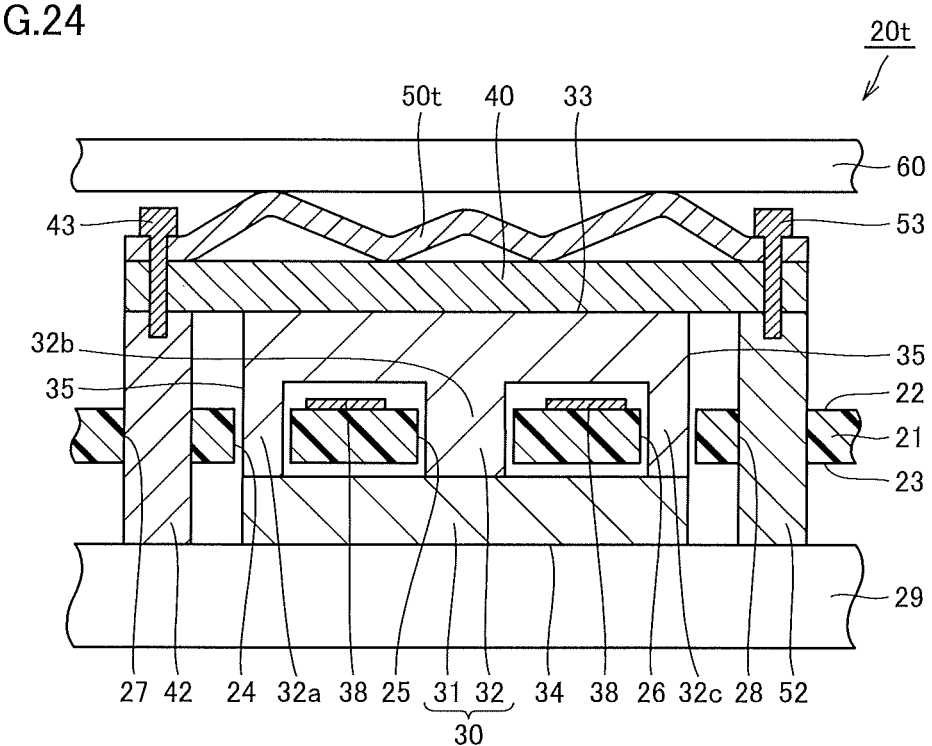
FIG. 24 is a schematic sectional view of a circuit device according to Modification 1 of Embodiment 16 of the present invention.

A circuit device 20$t$ according to Modification 1 of the present embodiment will be described with reference to FIG. 24. In circuit device 20$t$ according to Modification 1 of the present embodiment, first heat transfer member 40 may be composed of heat transfer portions 40$s$1 and 40$s$2 of circuit device 20$s$ of the present embodiment which are integrated with each other. Elastic member 50$t$ may be composed of elastic portions 50$s$1 and 50$s$2 of circuit device 20$s$ of the present embodiment which are integrated with each other. First heat transfer member 40 is mechanically and thermally connected to first support strut 42 and second support strut 52. Elastic member 50t is in contact with a plurality of portions of first heat transfer member 40 and presses first heat transfer member 40 toward core 30. Circuit device 20t according to Modification 1 of the present embodiment achieves effects similar to those of circuit device 20s according to the present embodiment.

In Modification 2 of the present embodiment, an elastic member 50t may be used in place of elastic member 50 in circuit device 20s of the present embodiment. In Modification 3 of the present embodiment, heat transfer portions 40s1 and 40s2 and elastic portions 50s1 and 50s2 may be attached to cover 60 in circuit device 20s of the present embodiment, as in circuit device 20r according to the modification of Embodiment 15. In Modification 4 of the present embodiment, cover 60 may be omitted.

Embodiment 17

Figure 25:
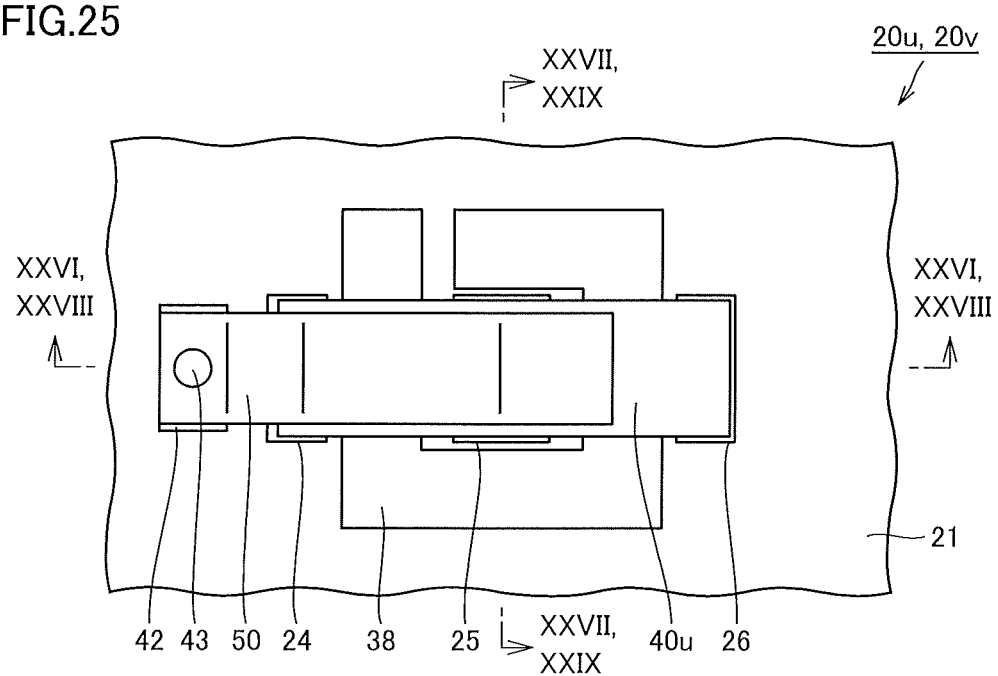
FIG. 25 is a schematic plan view of a circuit device according to Embodiment 17 of the present invention.
Figure 26:
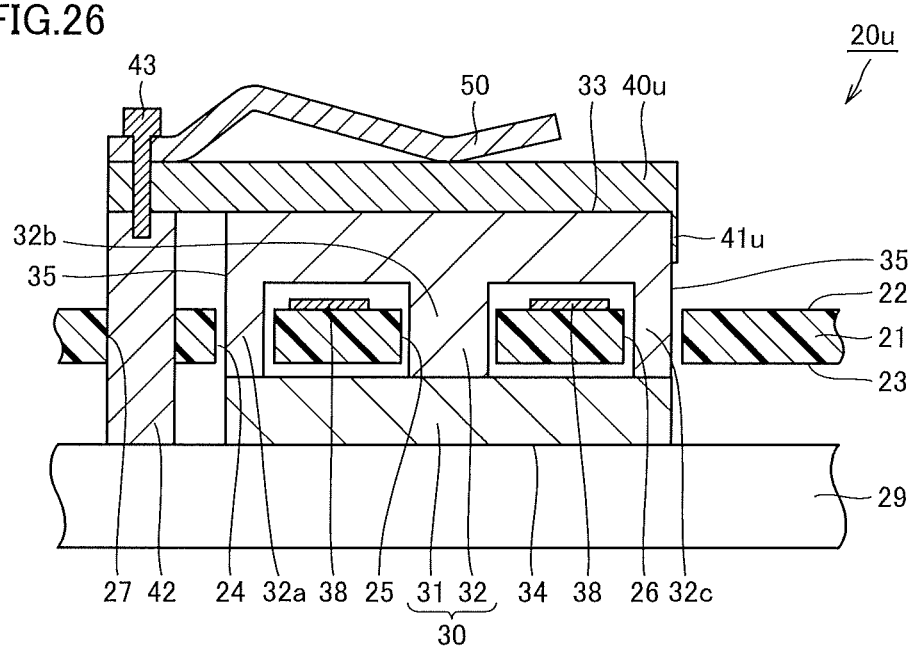
FIG. 26 is a schematic sectional view of the circuit device according to Embodiment 17 of the present invention, which is taken along section line XXVI-XXVI shown in FIG. 25.
Figure 27:
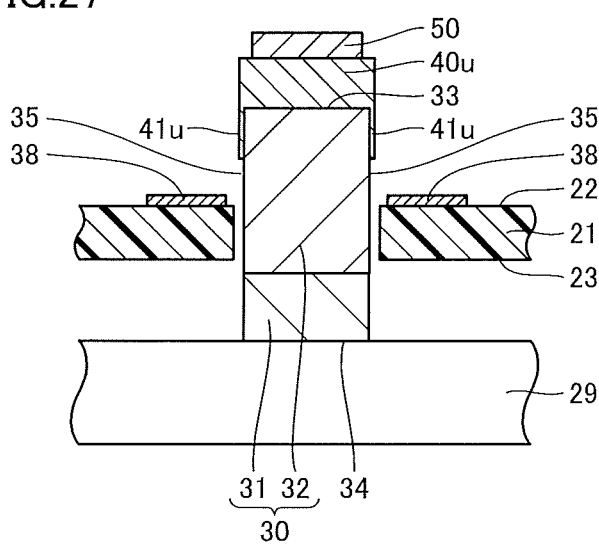
FIG. 27 is a schematic sectional view of the circuit device according to Embodiment 17 of the present invention, which is taken along section line XXVII-XXVII shown in FIG. 25.

A circuit device 20u according to Embodiment 17 will be described with reference to FIGS. 25 to 27. Circuit device 20u of the present embodiment includes similar components and achieves similar effects to those of circuit device 20b of Embodiment 3 but differs from circuit device 20b mainly in the following respects.

In circuit device 20u of the present embodiment, a first heat transfer member 40u is in surface contact with lateral portion 35 of core 30. Particularly, first heat transfer member 40u includes a projecting portion 41u projecting toward core 30. First heat transfer member 40u may be a rigid body, and projecting portion 41u may be a wall projecting toward core 30. Projection 41u may be a wall extending along lateral portion 35 of core 30. Projection 41u of first heat transfer member 40u is in surface contact with lateral portion 35 of core 30. Projection 41u of first heat transfer member 40u may be in surface contact with lateral portion 35 of core 30 except for lateral portion 35 facing first support strut 42. Projection 41u may be a burr occurring when a metal plate is stamped by pressing to form first heat transfer member 40u. Projection 41u may be formed by pressing or chipping of first heat transfer member 40u.

In circuit device 20u of the present embodiment, first heat transfer member 40u is in surface contact with lateral portion 35 of core 30 in addition to top portion 33 of core 30. Since first heat transfer member 40u is in contact with core 30 in a larger area, the thermal resistance between core 30 and first heat transfer member 40u can be reduced. Circuit device 20u of the present embodiment can further reduce or prevent a temperature rise of core 30.

In circuit device 20u of the present embodiment, first heat transfer member 40u is in surface contact with lateral portion 35 of core 30 (e.g., the lateral portion of second core portion 32) in addition to top portion 33 of core 30. This allows first heat transfer member 40u to position core 30 (e.g., second core portion 32) in a plane in which core 30 and first heat transfer member 40u are in contact with each other (except for a plane in which projecting portion 41u of first heat transfer member 40u and lateral portion 35 of core 30 are in contact with each other). Projection 41u of first heat transfer member 40u can position core 30 (e.g., second core portion 32) in the direction of the normal to the plane in which projecting portion 41u of first heat transfer member 40u and lateral portion 35 of core 30 are in contact with each other.

Figure 28:
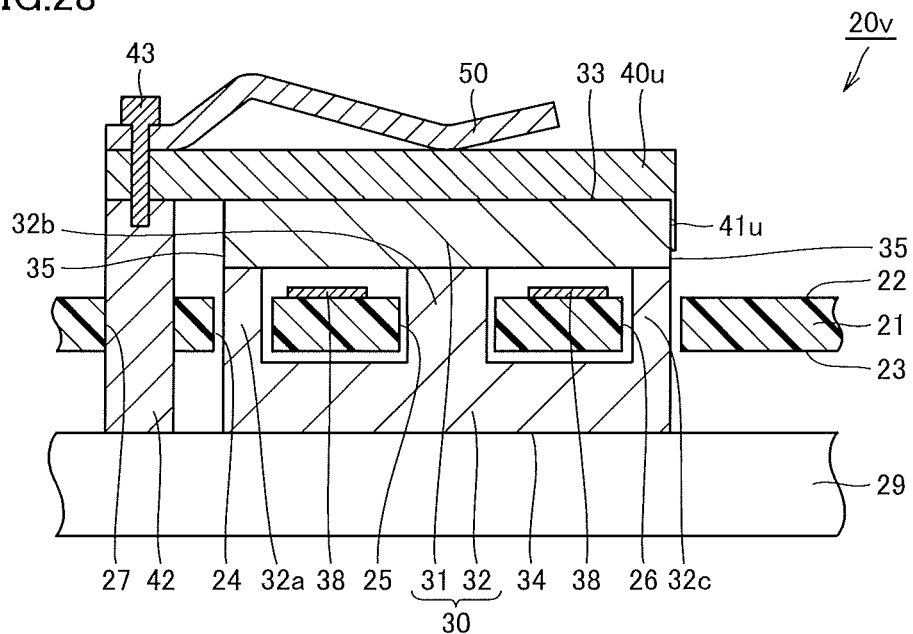
FIG. 28 is a schematic sectional view of a circuit device according to a modification of Embodiment 17 of the present invention, which is taken along section line XXVIII-XXVIII shown in FIG. 25.
Figure 29:
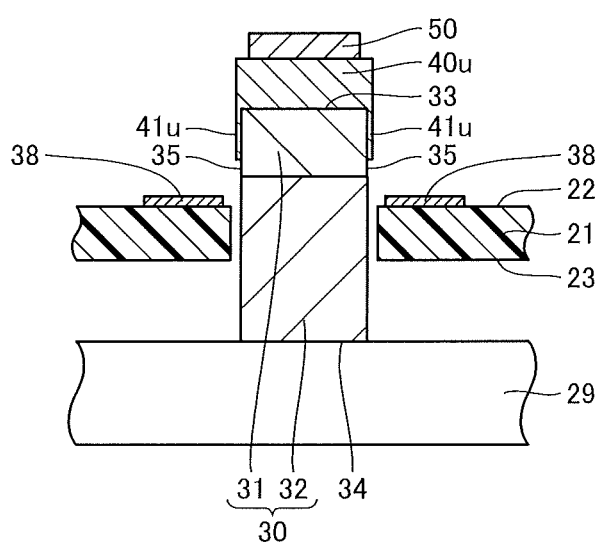
FIG. 29 is a schematic sectional view of the circuit device according to the modification of Embodiment 17 of the present invention, which is taken along section line XXIX-XXIX shown in FIG. 25.

A circuit device 20v according to a modification of the present embodiment will be described with reference to FIGS. 28 and 29. In circuit device 20v according to the modification of the present embodiment, second core portion 32 is placed on first heat dissipation member 29, and first core portion 31 is disposed on second core portion 32. First heat transfer member 40u is in surface contact with lateral portion 35 of core 30 (e.g., the lateral portion of first core portion 31) in addition to top portion 33 of core 30. This allows first heat transfer member 40u to position core 30 (e.g., first core portion 31) in a plane in which core 30 and first heat transfer member 40u are in contact with each other (except for a plane in which projecting portion 41u of first heat transfer member 40u and lateral portion 35 of core 30 are in contact with each other). Projection 41u of first heat transfer member 40u can position core 30 (e.g., first core portion 31) in the direction of the normal to a plane in which projecting portion 41u of first heat transfer member 40u and lateral portion 35 of core 30 are in contact with each other.

Figure 2:
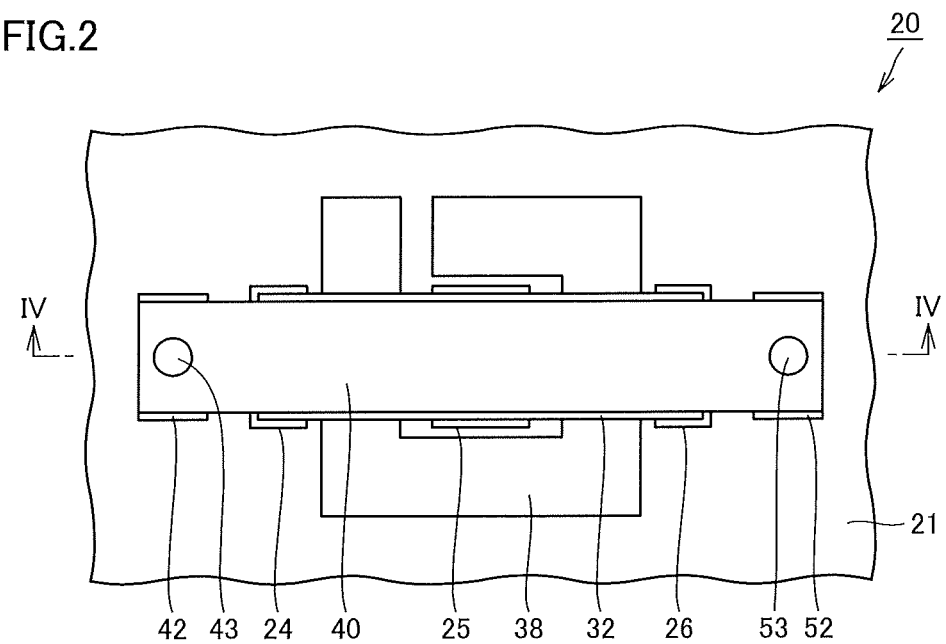
FIG. 2 is a schematic plan view of a circuit device according to Embodiment 1 of the present invention.
Figure 3:
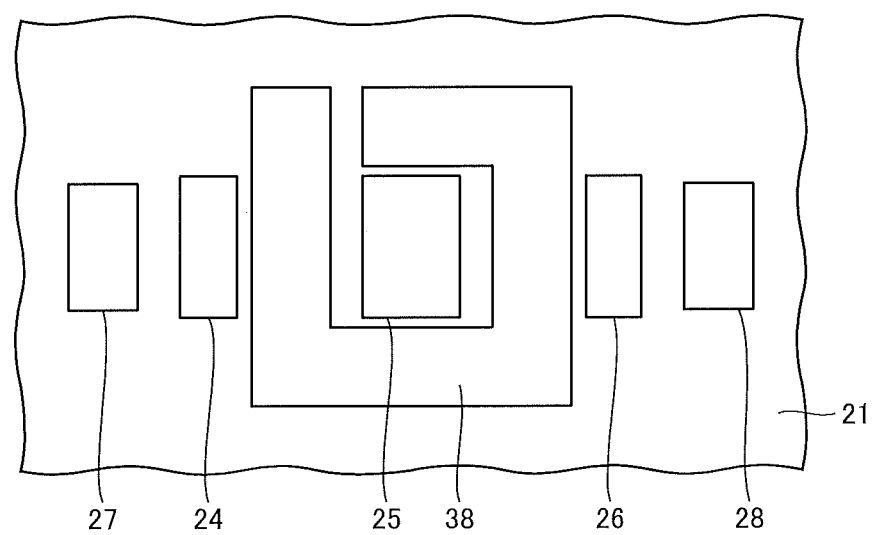
FIG. 3 is a schematic plan view of a substrate of the circuit device according to Embodiment 1 of the present invention.
Figure 4:
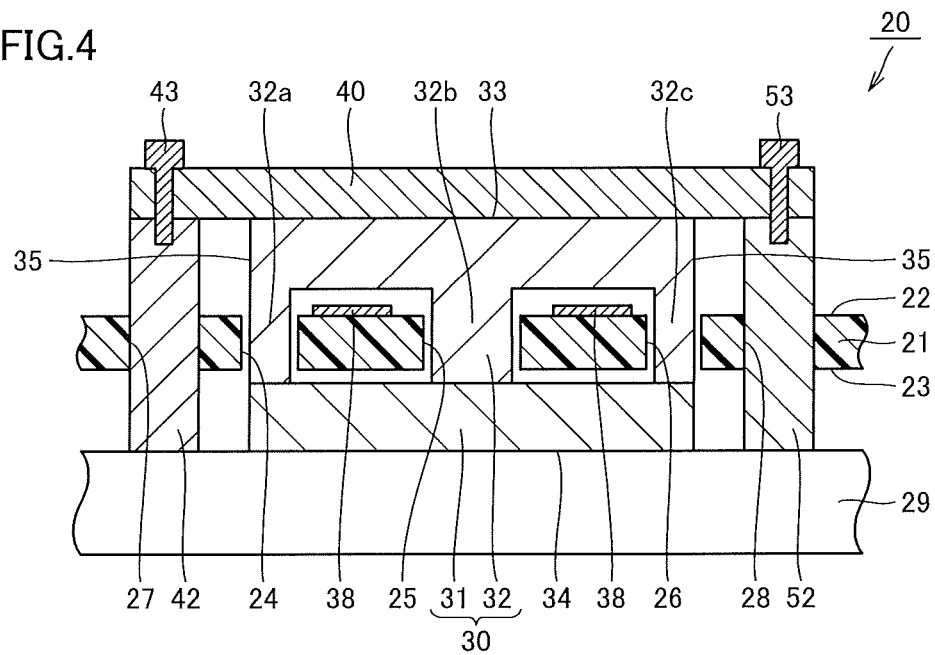
FIG. 4 is a schematic sectional view of the circuit device according to Embodiment 1 of the present invention, which is taken along section line IV-IV shown in FIG. 2.

A circuit device of another modification of the present embodiment may further include second support strut 52 as in Embodiment 1 shown in FIGS. 2 and 4, first heat transfer member 40u may be attached to second support strut 52 in addition to first support strut 42, and elastic member 50 may be omitted.

In circuit device 20u, 20v of the present embodiment, the modification thereof shown in FIGS. 25 to 29, cover 60 may further be provided. Elastic member 50 may be attached to cover 60. First heat transfer member 40u as well as elastic member 50 may be attached to cover 60.

Embodiment 18

Figure 30:
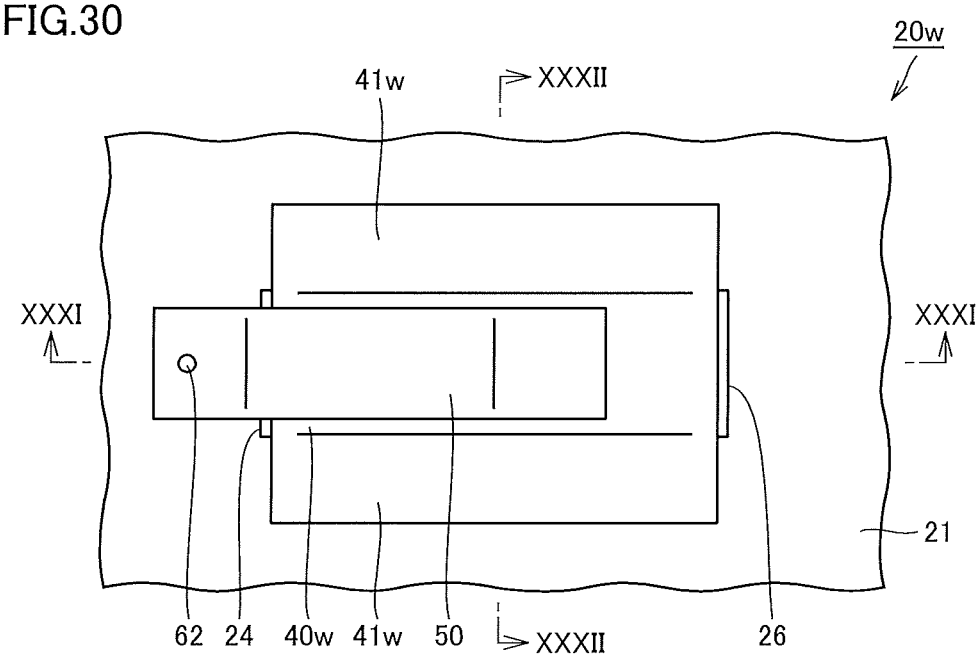
FIG. 30 is a schematic plan view of a circuit device according to Embodiment 18 of the present invention.
Figure 31:
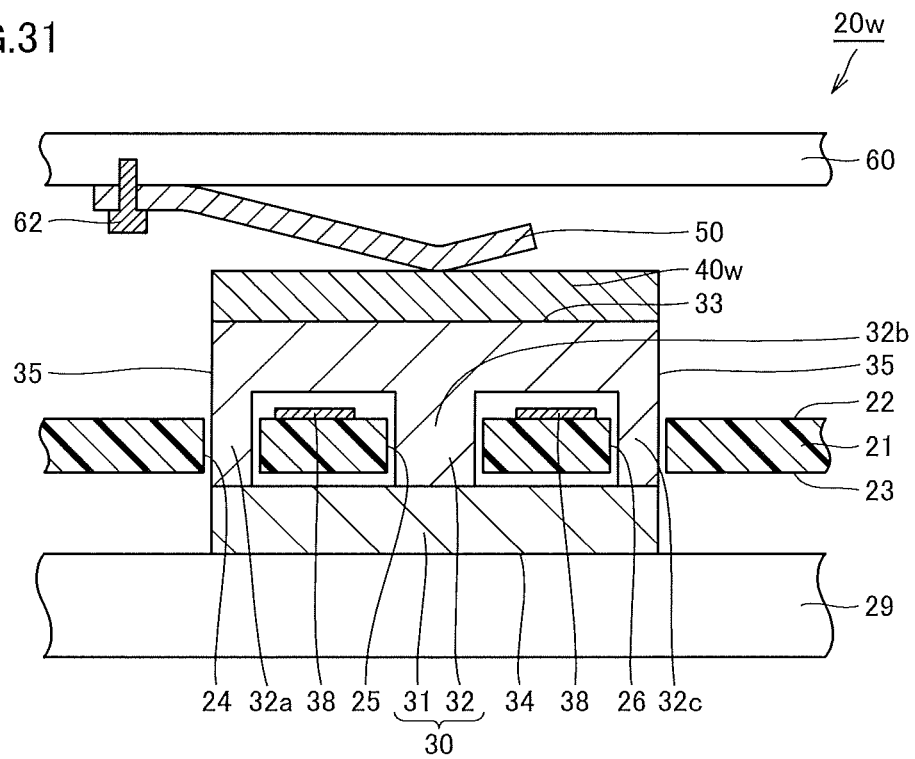
FIG. 31 is a schematic sectional view of the circuit device according to Embodiment 18 of the present invention, which is taken along section line XXXI-XXXI shown in FIG. 30.
Figure 32:
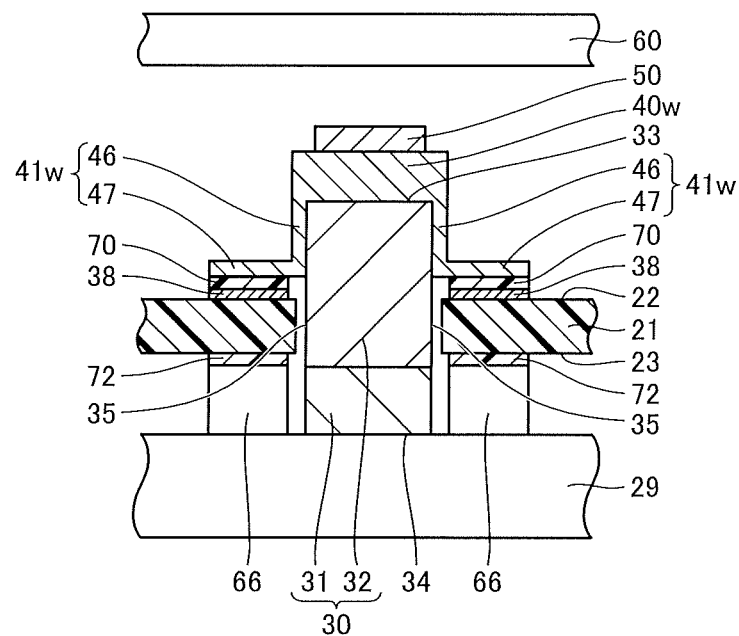
FIG. 32 is a schematic sectional view of the circuit device according to Embodiment 18 of the present invention, which is taken along section line XXXII-XXXII shown in FIG. 30.

A circuit device 20w according to Embodiment 18 will be described with reference to FIGS. 30 to 32. Circuit device 20w of the present embodiment includes components similar to those of circuit device 20j of Embodiment 10 but differs from circuit device 20j mainly in the following respects.

In circuit device 20w of the present embodiment, a first heat transfer member 40w is in surface contact with lateral portion 35 of core 30 to be thermally connected to core 30. Further, first heat transfer member 40w is thermally connected to coil 38. Particularly, first heat transfer member 40w includes a projecting portion 41w projecting toward core 30. Projection 41w includes a first portion 46 and a second portion 47. First portion 46 of projecting portion 41w may be a wall projecting toward core 30. First portion 46 of projecting portion 41w may be a wall extending along lateral portion 35 of core 30. First portion 46 of projecting portion 41w is in surface contact with lateral portion 35 of core 30. Projection 41w may include a pair of first portions 46, and the pair of first portions 46 may clamp core 30.

Second portion 47 of projecting portion 41w may extend from first portion 46 away from core 30. Second portion 47 of projecting portion 41w may cover the main surface of coil 38. Second portion 47 of projecting portion 41w may extend substantially parallel to the main surface of coil 38. Second portion 47 of projecting portion 41w may extend substantially parallel to first main surface 22 of substrate 21. Second portion 47 of projecting portion 41w may be thermally connected to coil 38 via second heat transfer member 70 having electrical insulation properties. Second portion 47 of projecting portion 41w may be in contact with second heat transfer member 70 having electrical insulation properties, and second heat transfer member 70 having electrical insulation properties may be in contact with coil 38. Preferably, second portion 47 of projecting portion 41w may be in surface contact with second heat transfer member 70 having electrical insulation properties, and second heat transfer member 70 having electrical insulation properties may be in surface contact with coil 38.

First heat transfer member 40w may press core 30 toward first heat dissipation member 29. Particularly, first heat transfer member 40w may press core 30 toward first heat dissipation member 29 by elastic member 50 pressing first heat transfer member 40w toward core 30. Projection 41w may press coil 38 toward first heat dissipation member 29. Particularly, projecting portion 41w may press coil 38 and substrate 21 toward first heat dissipation member 29 by elastic member 50 pressing first heat transfer member 40w including projecting portion 41w toward core 30.

First heat transfer member 40w may be made of a metal such as copper (Cu), aluminum (Al), iron (Fe), iron (Fe) alloy such as SUS304, copper (Cu) alloy such as phosphor bronze, or aluminum (Al) alloy such as ADC12. First heat transfer member 40w may be made of a resin material containing thermal conductive fillers, such as polyphenylene sulfide (PPS) or polyether ether ketone (PEEK). First heat transfer member 40w may have a thermal conductivity of 0.1 W/(m·K) or more, preferably 1.0 W/(m·K) or more, more preferably 10.0 W/(m·K) or more. First heat transfer member 40w may be rigid or flexible.

Second heat transfer member 70 has a thermal conductivity greater than that of substrate 21. The thermal conductivity of second heat transfer member 70 may be preferably two or more times, more preferably four or more times the thermal conductivity of substrate 21. Second heat transfer member 70 may be made of a rubber material such as silicone or urethane, a resin material such as acrylonitrile butadiene styrene (ABS), polybutylene terephthalate (PBT), polyphenylene sulfide (PPS), or phenol, a polymeric material such as polyimide, or a ceramic material such as alumina or aluminum nitride.

Since second heat transfer member 70 is disposed between coil 38 and second portion 47 of projecting portion 41w, second heat transfer member 70 can mechanically protect coil 38 from projecting portion 41w. Second heat transfer member 70 may be elastic. Second heat transfer member 70 having electrical insulation properties may be, for example, a silicone rubber sheet. Second heat transfer member 70 located between second portion 47 of projecting portion 41w and coil 38 may be crushed by the force by which elastic member 50 presses first heat transfer member 40w including projecting portion 41w. Second heat transfer member 70 to be crushed has a much lower thermal resistance. First heat transfer member 40 including projecting portion 41w may have electrical insulation properties, and projecting portion 41w may be in direct contact with coil 38.

Circuit device 20w of the present embodiment includes third support struts 66 in place of first support strut 42 and first fixing member 43 in circuit device 20j of Embodiment 10. Circuit device 20w of the present embodiment may further include a third heat transfer member 72 between substrate 21 and third support struts 66. In circuit device 20w of the present embodiment, substrate 21 has no through-hole 27 that is provided in circuit device 20j of Embodiment 10.

Third support struts 66 may thermally and mechanically connect substrate 21 to first heat dissipation member 29. Third support struts 66 may support substrate 21. Third support struts 66 may be disposed so as to partially overlap at least a part of coil 38 in a plan view seen from the direction perpendicular to second main surface 23. Third support struts 66 may be disposed along the longitudinal direction of coil 38 in a plan view seen from the direction perpendicular to second main surface 23. Third support struts 66 may be fixed to first heat dissipation member 29. Third support struts 66 may be members separate from first heat dissipation member 29 or may be integrated with third support strut 66. Third support struts 66 may be in surface contact with second main surface 23 of substrate 21.

Third support struts 66 may be made of a material similar to the material for first support strut 42 and second support strut 52 of Embodiment 1. Third support struts 66 may have a structure and a function similar to those of first support strut 42 and second support strut 52 of Embodiment 1. For example, third support struts 66 may have a thermal conductivity greater than that of substrate 21. Third support struts 66 may have a thermal conductivity of 0.1 W/(m·K) or more, preferably 1.0 W/(m·K) or more, more preferably 10.0 W/(m·K) or more. Third support struts 66 may shield a magnetic flux leaking from coil 38. Third support struts 66 may prevent or reduce a displacement of core 30 which is caused by a vibration or an impact applied to circuit device 20.

Third heat transfer member 72 is disposed on second main surface 23. Third heat transfer member 72 may be in surface contact with second main surface 23 of substrate 21 and third support struts 66. At least a part of third heat transfer member 72 may be disposed so as to overlap coil 38 in a plan view seen from the direction perpendicular to second main surface 23. Third heat transfer member 72 may be disposed along the longitudinal direction of coil 38 in a plan view seen from the direction perpendicular to second main surface 23.

Third heat transfer member 72 has a thermal conductivity greater than that of substrate 21. The thermal conductivity of third heat transfer member 72 may be preferably two or more times, more preferably four or more times the thermal conductivity of substrate 21. Third heat transfer member 72 may be made of a rubber material such as silicone or urethane, a resin material such as acrylonitrile butadiene styrene (ABS), polybutylene terephthalate (PBT), polyphenylene sulfide (PPS), or phenol, a polymeric material such as polyimide, or a ceramic material such as alumina or aluminum nitride. Third heat transfer member 72 may be made of a material identical to the material for second heat transfer member 70.

Since third heat transfer member 72 is disposed between substrate 21 and third support struts 66, third heat transfer member 72 may mechanically protect substrate 21 from third support struts 66. Third heat transfer member 72 may be elastic. Third heat transfer member 72 may be, for example, a silicone rubber sheet. Third heat transfer member 72 located between substrate 21 and third support struts 66 may be crushed by the force by which elastic member 50 presses first heat transfer member 40w including projecting portion 41w. Third heat transfer member 72 to be crushed has a much lower thermal resistance. Third heat transfer member 72 may have electrical insulation properties. Third support struts 66 may have electrical insulation properties, and third support struts 66 may be in direct contact with second main surface 23 of substrate 21.

Figure 33:
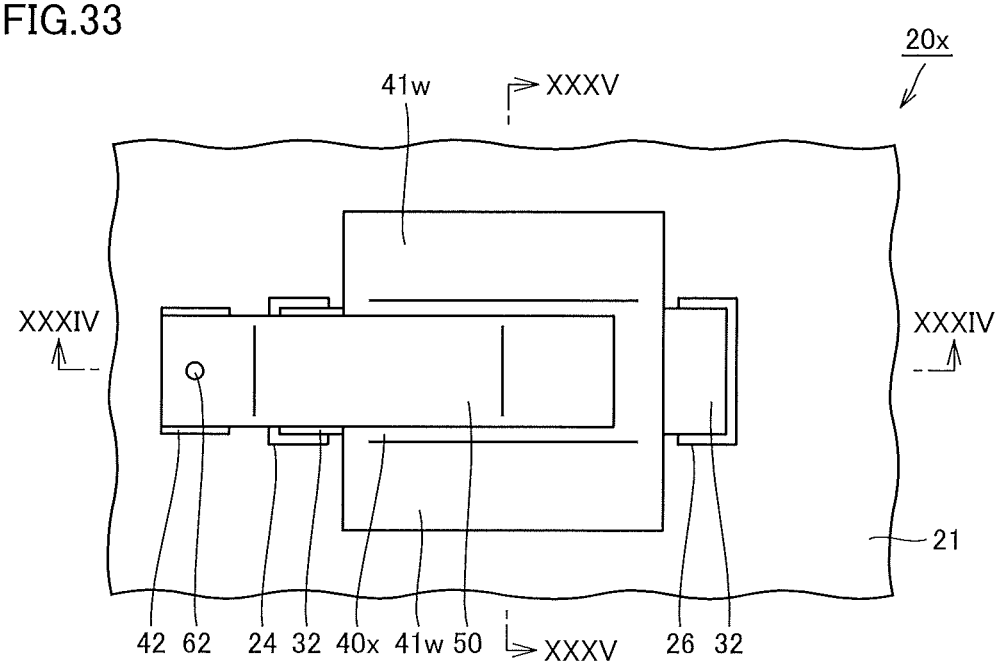
FIG. 33 is a schematic plan view of a circuit device according to Modification 1 of Embodiment 18 of the present invention.
Figure 34:
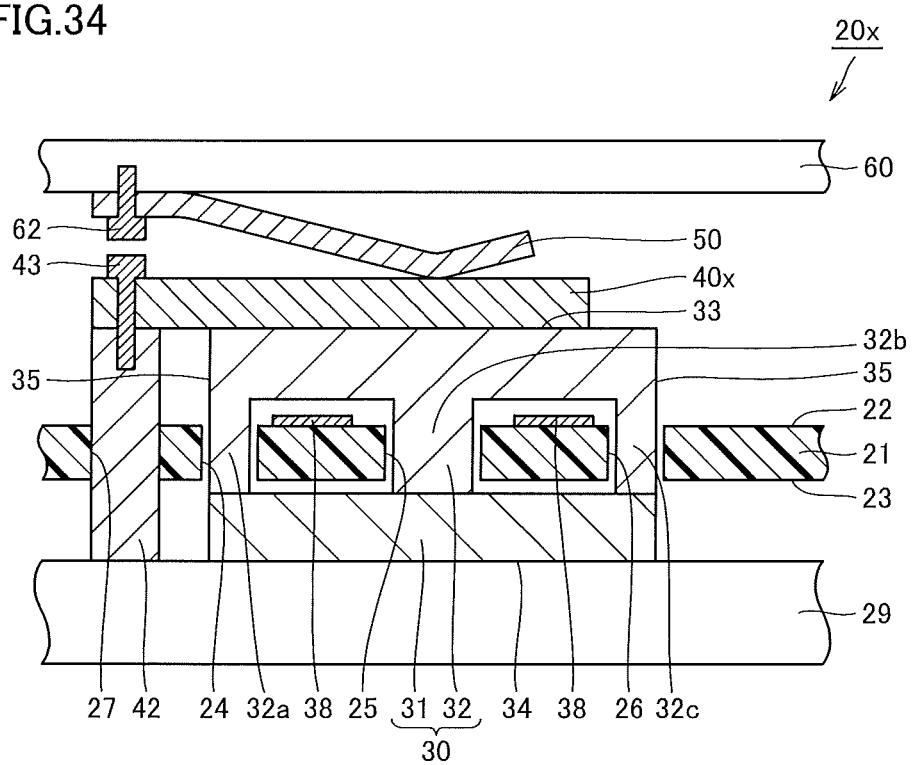
FIG. 34 is a schematic sectional view of the circuit device according to Modification 1 of Embodiment 18 of the present invention, which is taken along section line XXXIV-XXXIV shown in FIG. 33.
Figure 35:
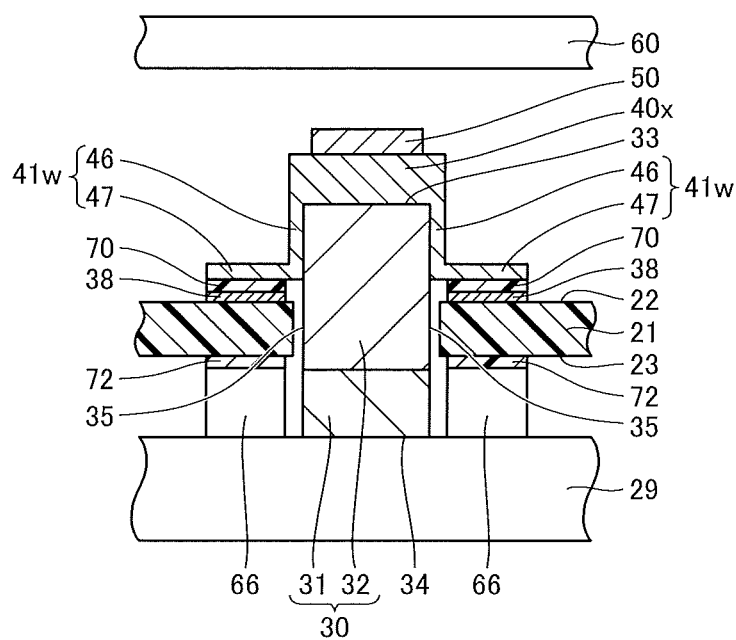
FIG. 35 is a schematic sectional view of the circuit device according to Modification 1 of Embodiment 18 of the present invention, which is taken along section line XXXV-XXXV shown in FIG. 33.

A circuit device 20x of Modification 1 of the present embodiment will be described with reference to FIGS. 33 to 35. In circuit device 20x of Modification 1 of the present embodiment, a first heat transfer member 40x is attached to first support strut 42 with first fixing member 43, as in circuit device 20j of Embodiment 10. Substrate 21 has through-hole 27, and first support strut 42 passes through through-hole 27 to be thermally and mechanically connected to first heat dissipation member 29. First heat transfer member 40x of Modification 1 of the present embodiment has a structure similar to that of first heat transfer member 40w of the present embodiment but differs from first heat transfer member 40w in the following two respects. First heat transfer member 40x has a portion to be attached to first support strut 42. First heat transfer member 40x does not need to cover top portion 33 of core 30 above third leg portion 32c, and top portion 33 of core 30 above third leg portion 32c may be exposed from first heat transfer member 40x.

First support strut 42 may have a thermal resistance lower than that of first heat transfer member 40x. The sectional area of first support strut 42 in a plan view orthogonal to the longitudinal direction of first support strut 42 may be larger than the sectional area of first heat transfer member 40 in a plan view orthogonal to the longitudinal direction of first heat transfer member 40x located on top portion 33 of core 30.

Circuit device 20x of Modification 1 of the present embodiment includes first support strut 42 thermally and mechanically connecting first heat transfer member 40x to first heat dissipation member 29. The heat generated in core 30 during the operation of circuit device 20x may be transferred to first heat dissipation member 29 and cover 60 with a lower thermal resistance via first heat transfer member 40x and first support strut 42. Circuit device 20x of Modification 1 of the present embodiment can further reduce or prevent a temperature rise of core 30.

In a circuit device of Modification 2 of the present embodiment, first support strut 42 and second support strut 52 may be provided, first heat transfer member 40x may be attached to first support strut 42 and second support strut 52, and no elastic member 50 nor third fixing member 62 may be provided, as in circuit device 20 of Embodiment 1. The circuit device of Modification 2 of the present embodiment may include no cover 60.

A circuit device of Modification 3 of the present embodiment may include elastic member 50m that is the elastic plate included in circuit device 20m of Embodiment 12, in place of elastic member 50 included in circuit device 20w, 20x of the present embodiment, Modifications 1 and 2 thereof. Elastic member 50m may press first heat transfer member 40w, 40x toward core 30.

Circuit device 20w, 20x of the present embodiment, Modifications 1 to 3 thereof has effects similar to those of circuit device 20j of Embodiment 10 but differs from circuit device 20j mainly in the following respects.

Circuit device 20w, 20x of the present embodiment, Modifications 1 to 3 thereof includes core 30, substrate 21, coil 38, first heat transfer member 40w, 40x, and first heat dissipation member 29. Core 30 includes top portion 33, bottom portion 34 opposite to top portion 33, and lateral portion 35 between top portion 33 and bottom portion 34. Substrate 21 has first main surface 22 and second main surface 23 opposite to first main surface 22. Coil 38 is disposed on first main surface 22 and surrounds at least a part of core 30. First heat transfer member 40w, 40x is in surface contact with top portion 33 of core 30. First heat dissipation member 29 is in surface contact with bottom portion 34 of core 30 and faces second main surface 23. First heat transfer member 40w, 40x includes projecting portion 41w thermally connected to coil 38. First heat transfer member 40w, 40x presses core 30 toward first heat dissipation member 29. Projection 41w presses coil 38 toward first heat dissipation member 29.

Since first heat transfer member 40w, 40x and first heat dissipation member 29 are in surface contact with core 30, the thermal resistance between first heat transfer member 40w, 40x and core 30 and the thermal resistance between first heat dissipation member 29 and core 30 can be reduced. The heat generated in core 30 during the operation of circuit device 20w, 20x can be dissipated to first heat transfer member 40w, 40x and first heat dissipation member 29 with a low thermal resistance. Circuit device 20w, 20x of the present embodiment can prevent or reduce a temperature rise of core 30.

Since a current flows through coil 38 during the operation of circuit device 20w, 20x, coil 38 generates heat. The heat generated in coil 38 during the operation of circuit device 20w, 20x can be dissipated to first heat transfer member 40w, 40x including projecting portion 41w thermally connected to coil 38. Circuit device 20w, 20x of the present embodiment, Modifications 1 to 3 thereof can prevent or reduce a temperature rise of coil 38.

Further, first heat transfer member 40w, 40x presses core 30 toward first heat dissipation member 29, and also, projecting portion 41w presses coil 38 toward first heat dissipation member 29. Circuit device 20w, 20x of the present embodiment, Modifications 1 to 3 thereof allows first heat transfer member 40w, 40x including projecting portion 41w to position core 30 with respect to first heat dissipation member 29 and coil 38.

In circuit device 20w, 20x of the present embodiment, Modifications 1 to 3 thereof, projecting portion 41w may be in surface contact with lateral portion 35 of core 30. Since first heat transfer member 40w, 40x including projecting portion 41w is in contact with core 30 in a larger area, the thermal resistance between core 30 and first heat transfer member 40w, 40x can be reduced. Circuit device 20w, 20x of the present embodiment, Modifications 1 to 3 thereof can further reduce or prevent a temperature rise of core 30.

Circuit device 20w, 20x of the present embodiment, Modifications 1 to 3 thereof may further include a second heat transfer member 70 that is in contact with projecting portion 41w and coil 38 and has electrical insulation properties. Since second heat transfer member 70 has electrical insulation properties, a material having a low electric resistivity and a low thermal resistivity may be used as first heat transfer member 40w, 40x including projecting portion 41w. A material used for first heat transfer member 40w, 40x including projecting portion 41w can be selected from more choices. Second heat transfer member 70 can mechanically protect coil 38 from projecting portion 41w. The heat generated in coil 38 during the operation of circuit device 20w, 20x can be transferred to first heat transfer member 40w, 40x with a low thermal resistance. Circuit device 20w, 20x of the present embodiment, Modifications 1 to 3 thereof can prevent or reduce a temperature rise of coil 38.

Circuit device 20w, 20x of the present embodiment, Modifications 1 to 3 thereof may further include third support struts 66. Third support struts 66 may thermally connect substrate 21 to first heat dissipation member 29 and also support substrate 21. Some of the heat generated in core 30 and coil 38 during the operation of circuit device 20w, 20x is transferred to substrate 21, which can increase the temperature of substrate 21. The heat transferred to substrate 21 can be transferred to first heat dissipation member 29 with a low thermal resistance via third support struts 66. Projection 41w presses coil 38 toward first heat dissipation member 29 to press substrate 21 on which coil 38 is disposed toward third support struts 66. Substrate 21 thus may be thermally connected to third support struts 66 reliably. Circuit device 20w, 20x of the present embodiment can prevent or reduce a temperature rise of core 30, coil 38, and substrate 21.

Circuit device 20w, 20x of the present embodiment, Modifications 1 to 3 thereof may further include third heat transfer member 72. Third heat transfer member 72 may be in contact with second main surface 23 and third support struts 66. Third heat transfer member 72 can mechanically protect substrate 21 from third support struts 66. Further, some of the heat generated in core 30 and coil 38 during the operation of circuit device 20w, 20x is transferred to substrate 21, which can increase the temperature of substrate 21. The heat transferred to substrate 21 can be transferred to first heat dissipation member 29 with a low thermal resistance via third heat transfer member 72 and third support struts 66. Projection 41w presses coil 38 toward first heat dissipation member 29 to press substrate 21 on which coil 38 is disposed toward third support struts 66. Substrate 21 can thus be thermally connected to third heat transfer member 72 and third support struts 66 reliably. Circuit device 20w, 20x of the present embodiment can prevent or reduce a temperature rise of core 30, coil 38, and substrate 21.

Embodiment 19

Figure 36:
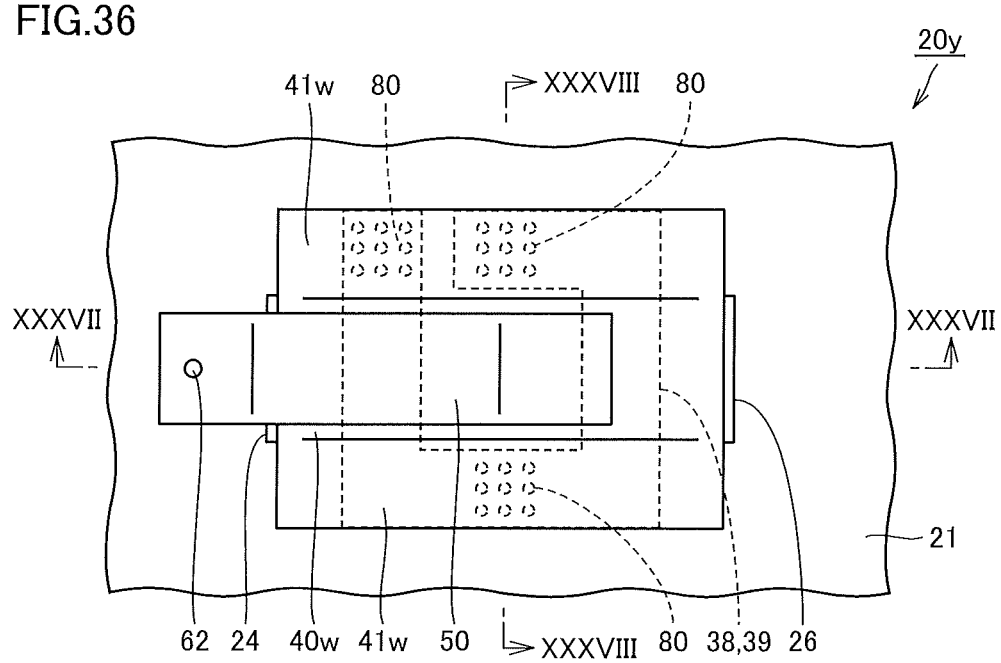
FIG. 36 is a schematic plan view of a circuit device according to Embodiment 19 of the present invention.
Figure 37:
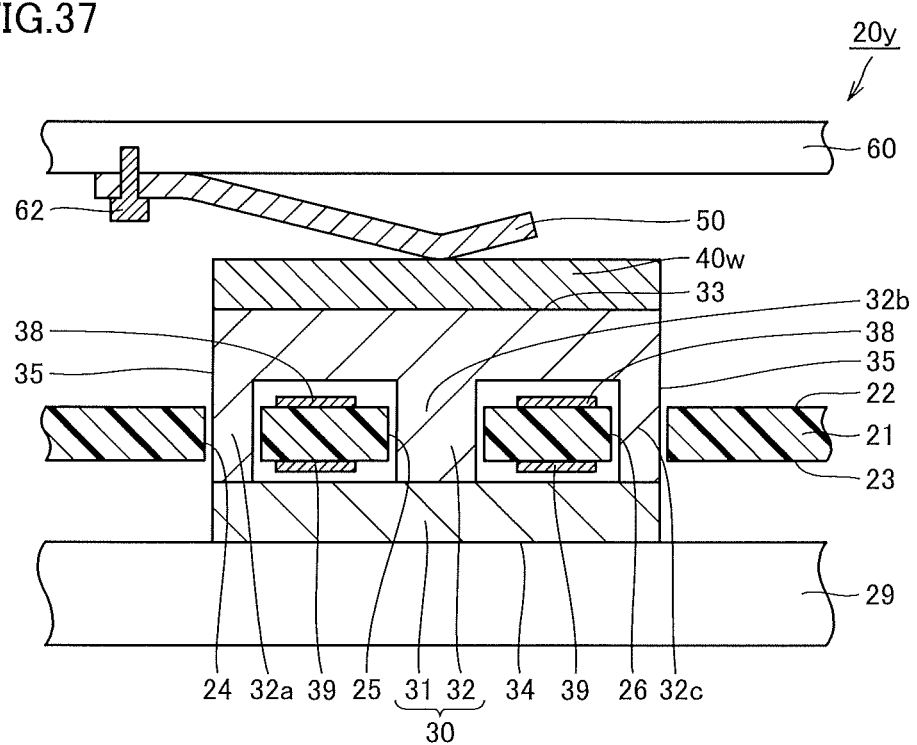
FIG. 37 is a schematic sectional view of the circuit device according to Embodiment 19 of the present invention, which is taken along section line XXXVII-XXXVII shown in FIG. 36.
Figure 38:
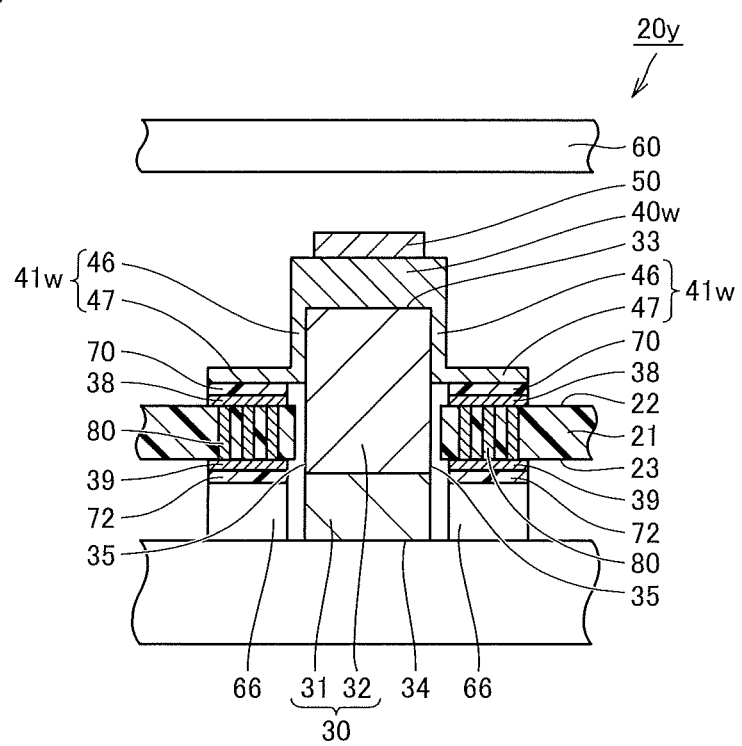
FIG. 38 is a schematic sectional view of the circuit device according to Embodiment 19 of the present invention, which is taken along section line XXXVIII-XXXVIII shown in FIG. 36.

A circuit device 20y according to Embodiment 19 will be described with reference to FIGS. 36 to 38. Circuit device 20y of the present embodiment includes components similar to those of circuit device 20w of Embodiment 18 but differs from circuit device 20w mainly in the following respects.

Circuit device 20y of the present embodiment further includes a second coil 39. Second coil 39 may have a thin-film-shaped coil pattern. Second coil 39 may be, for example, a thin conductor layer having a thickness of 100 µm. Second coil 39 may be a winding. A part of second coil 39 may be sandwiched between first core portion 31 and second core portion 32. Second coil 39 is made of a material having an electric resistivity lower than that of substrate 21 and a thermal resistivity lower than that of substrate 21. Second coil 39 may be made of a metal such as copper (Cu), gold (Au), copper (Cu) alloy, nickel (Ni) alloy, gold (Au) alloy, or silver (Ag) alloy.

Second coil 39 is disposed on second main surface 23 and surrounds at least a part of core 30. Substrate 21 is a double-sided circuit board in which coil 38 is disposed on first main surface 22 and second coil 39 is disposed on second main surface 23. Second coil 39 surrounding at least a part of core 30 means that second coil 39 is wound around at least a part of core 30 a half turn or more. In the present embodiment, second coil 39 is wound around the penetration portion (second leg portion 32b) of core 30 about one turn. Second coil 39 may surround the penetration portion (second leg portion 32b) of core 30. Second coil 39 may be formed in a pattern identical to that of coil 38 or in a pattern different from that of coil 38 in a plan view of coil 38 and second coil 39.

Third heat transfer member 72 may be in contact with second coil 39 and third support struts 66 and have electrical insulation properties. Third heat transfer member 72 and third support struts 66 may have an area larger than that of second coil 39 in a plan view of second coil 39. Third heat transfer member 72 may be in contact with second main surface 23 of substrate 21 and second coil 39. Since third heat transfer member 72 is disposed between second coil 39 and third support struts 66, third heat transfer member 72 can mechanically protect second coil 39 from third support struts 66.

Third heat transfer member 72 of the present embodiment may have a thermal conductivity similar to that of third heat transfer member 72 of Embodiment 18. Third heat transfer member 72 of the present embodiment may be made of a material similar to the material for third heat transfer member 72 of Embodiment 18. Third support struts 66 may have electrical insulation properties and be in direct contact with second coil 39.

In circuit device 20y of the present embodiment, substrate 21 may include thermal vias 80 penetrating between first main surface 22 and second main surface 23. Thermal vias 80 thermally connect coil 38 and second coil 39. Thermal vias 80 may be made of a metal having a thermal conductivity higher than that of substrate 21, such as copper (Cu), gold (Au), copper (Cu) alloy, nickel (Ni) alloy, gold (Au) alloy, or silver (Ag) alloy. Thermal vias 80 may be made of a resin material having a thermal conductivity higher than that of substrate 21 and containing thermal conductive fillers, such as polyphenylene sulfide (PPS) or polyether ether ketone (PEEK). Thermal vias 80 may have a thermal conductivity of 0.1 W/(m·K) or more, preferably 1.0 W/(m·K) or more, more preferably 10.0 W/(m·K) or more.

Thermal vias 80 may have electrical conduction properties or electrical insulation properties. Coil 38 and second coil 39 may be electrically connected in parallel to each other via thermal vias 80 having electrical conduction properties.

Figure 39:
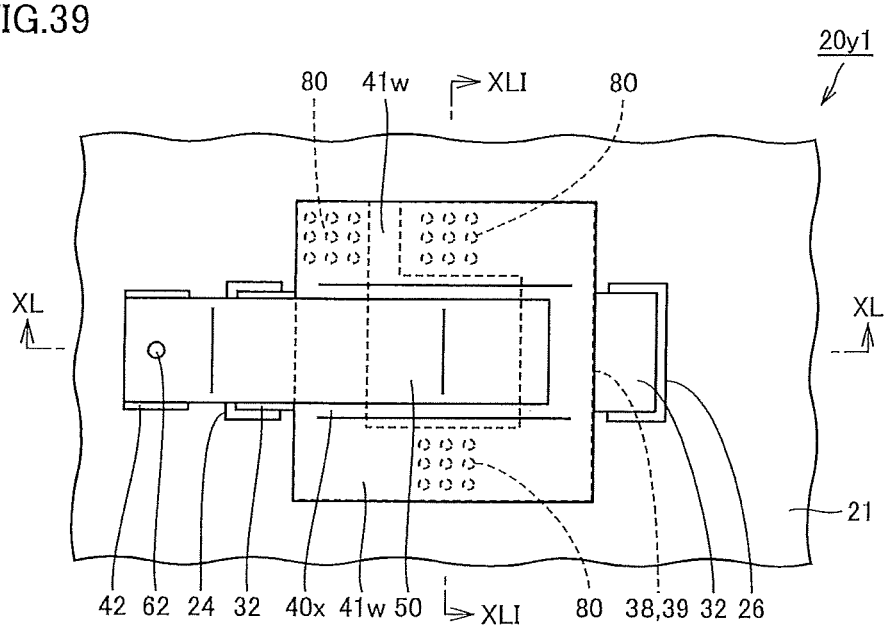
FIG. 39 is a schematic plan view of a circuit device according to a modification of Embodiment 19 of the present invention.
Figure 40:
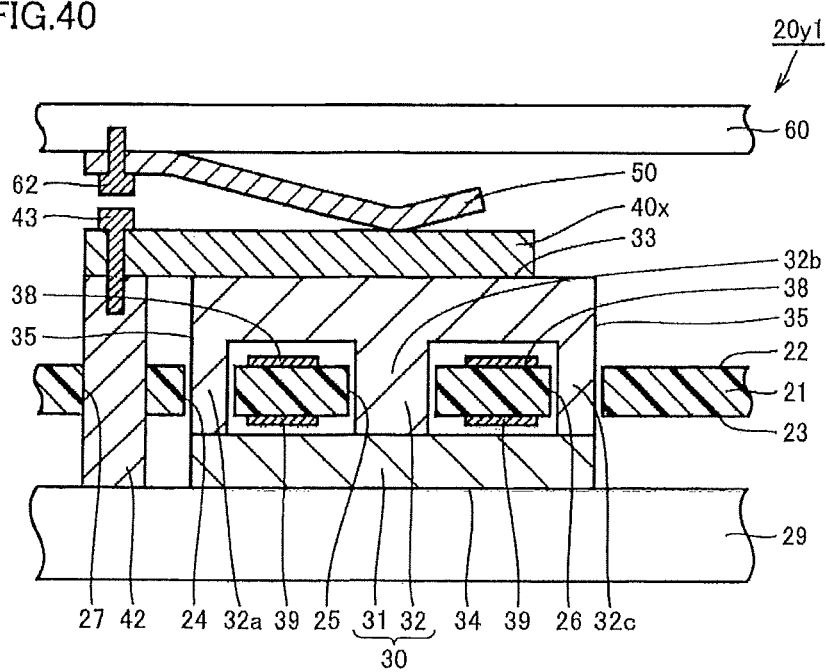
FIG. 40 is a schematic sectional view of the circuit device according to the modification of Embodiment 19 of the present invention, which is taken along section line XL-XL shown in FIG. 39.
Figure 41:
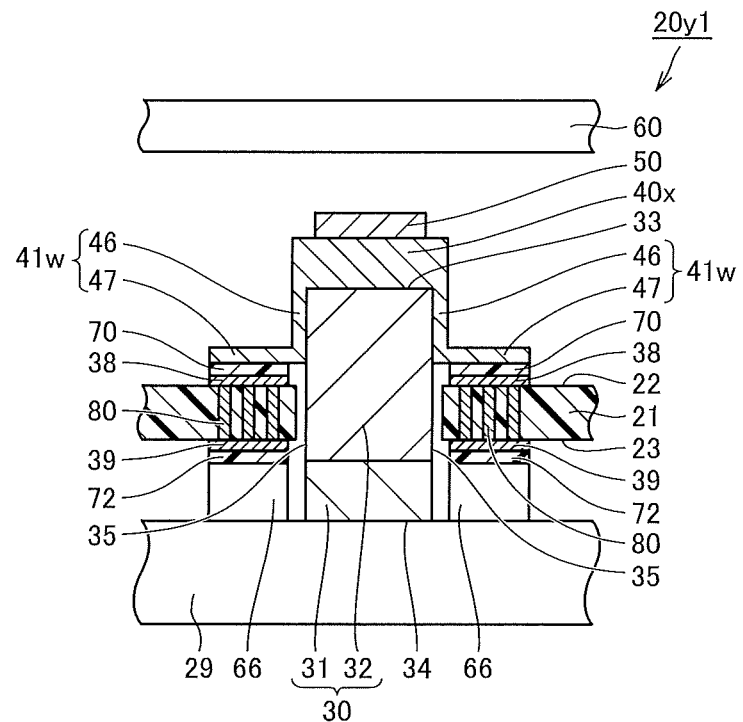
FIG. 41 is a schematic sectional view of the circuit device according to the modification of Embodiment 19 of the present invention, which is taken along section line XLI-XLI shown in FIG. 39.

In a circuit device 20y1 of a modification of the present embodiment shown in FIGS. 39 to 41, first heat transfer member 40x may be attached to first support strut 42 with first fixing member 43, as in circuit device 20x of the modification of Embodiment 18.

Circuit device 20y, 20y1 of the present embodiment, the modification thereof achieves effects similar to those of circuit device 20w, 20x of Embodiment 18, the modification thereof but differs from circuit device 20w, 20x mainly in the following respects.

Circuit device 20y, 20y1 of the present embodiment, the modification thereof further includes second coil 39 and third support struts 66. Second coil 39 is disposed on second main surface 23 and also surrounds at least a part of core 30. Third support struts 66 thermally connect second coil 39 to first heat dissipation member 29 and also support substrate 21.

Since a current flows through second coil 39 during the operation of circuit device 20y, 20y1, second coil 39 generates heat. The heat generated in second coil 39 during the operation of circuit device 20y, 20y1 may be dissipated to first heat dissipation member 29 via third support struts 66. Circuit device 20y, 20y1 of the present embodiment, the modification thereof can further reduce or prevent a temperature rise of second coil 39. Further, not only coil 38 but also second coil 39 is wound around core 30. Circuit device 20y, 20y1 of the present embodiment, the modification thereof can increase the number of turns by which coils (coil 38 and second coil 39) are wound around core 30, which can improve the performance of circuit device 20y, 20y1.

Circuit device 20y, 20y1 of the present embodiment, the modification thereof may further include third heat transfer member 72. Third heat transfer member 72 is in contact with second coil 39 and third support struts 66 and also has electrical insulation properties. Third heat transfer member 72 can mechanically protect second coil 39 from third support struts 66. Further, some of the heat generated in core 30, coil 38, and second coil 39 during the operation of circuit device 20y, 20y1 is transferred to substrate 21, which can increase the temperature of substrate 21. The heat transferred to substrate 21 can be transferred to first heat dissipation member 29 with a low thermal resistance via third heat transfer member 72 and third support struts 66. Projection 41w presses coil 38 toward first heat dissipation member 29 to press substrate 21 on which coil 38 is disposed toward third support struts 66. Substrate 21 can thus be thermally connected to third heat transfer member 72 and third support struts 66 reliably. Circuit device 20y, 20y1 of the present embodiment can reliably prevent or reduce a temperature rise of core 30, coil 38, second coil 39, and substrate 21.

In circuit device 20y, 20y1 of the present embodiment, the modification thereof, substrate 21 may include thermal vias 80 penetrating between first main surface 22 and second main surface 23. Thermal vias 80 may thermally connect coil 38 and second coil 39. Since a current flows through coil 38 and second coil 39 during the operation of circuit device 20y, 20y1, coil 38 and second coil 39 generate heat. Some of the heat generated in core 30, coil 38, and second coil 39 during the operation of circuit device 20y, 20y1 is transferred to substrate 21, which can increase the temperature of substrate 21. The heat generated in coil 38 and second coil 39 during the operation of circuit device 20y, 20y1 and the heat transferred to substrate 21 can be dissipated to first heat dissipation member 29 via thermal vias 80, second coil 39, third heat transfer member 72, and third support struts 66. Circuit device 20y, 20y1 of the present embodiment, the modification thereof can reliably prevent or reduce a temperature rise of core 30, coil 38, second coil 39, and substrate 21.

Embodiment 20

Figure 42:
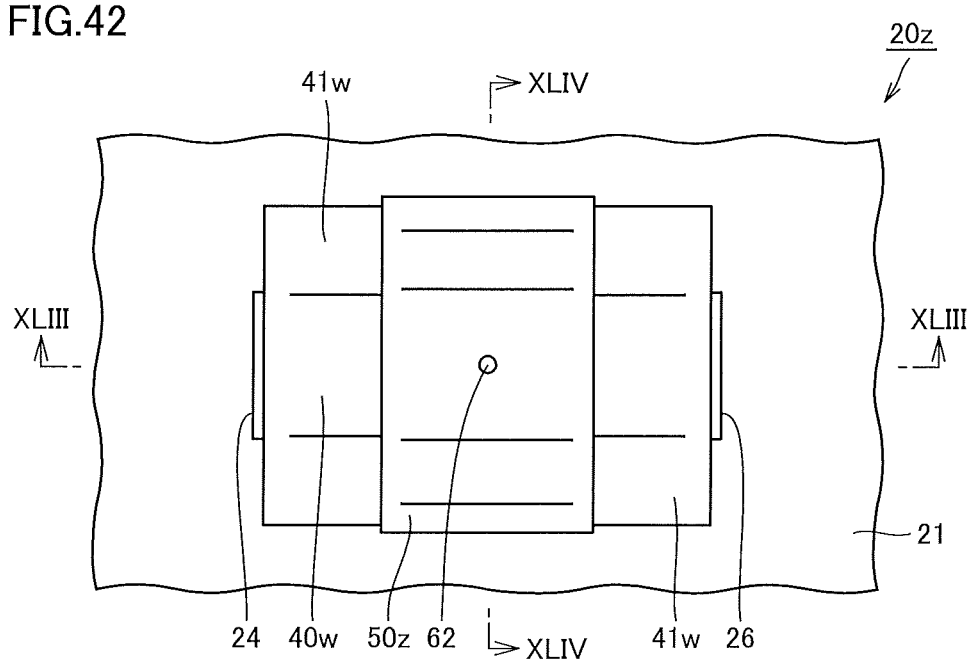
FIG. 42 is a schematic plan view of a circuit device according to Embodiment 20 of the present invention.
Figure 43:
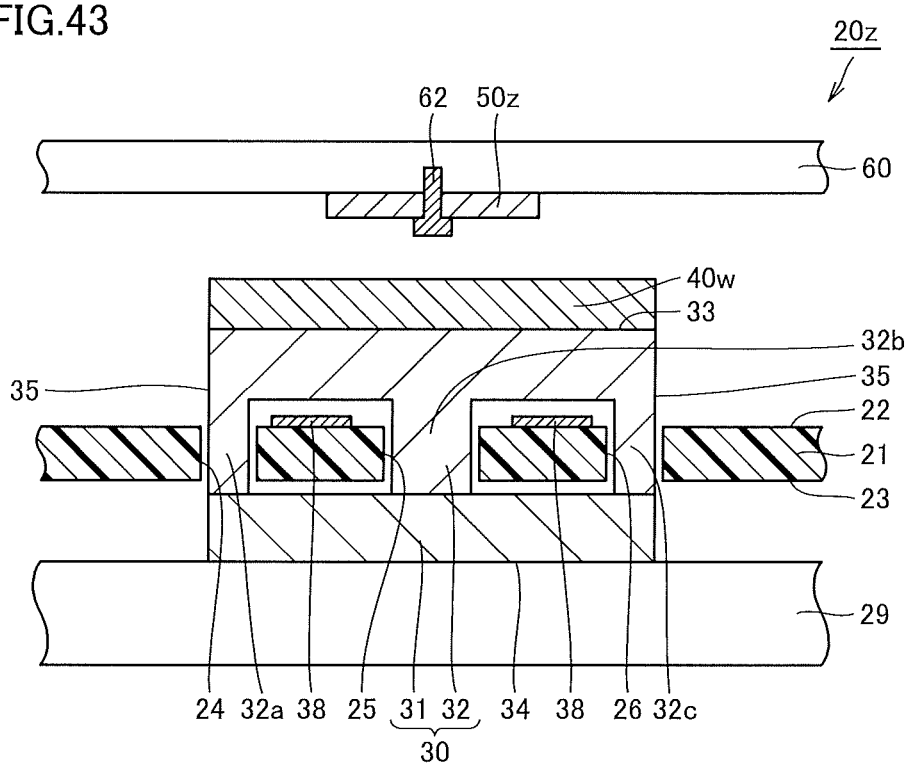
FIG. 43 is a schematic sectional view of the circuit device according to Embodiment 20 of the present invention, which is taken along line XLIII-XLIII shown in FIG. 42.
Figure 44:
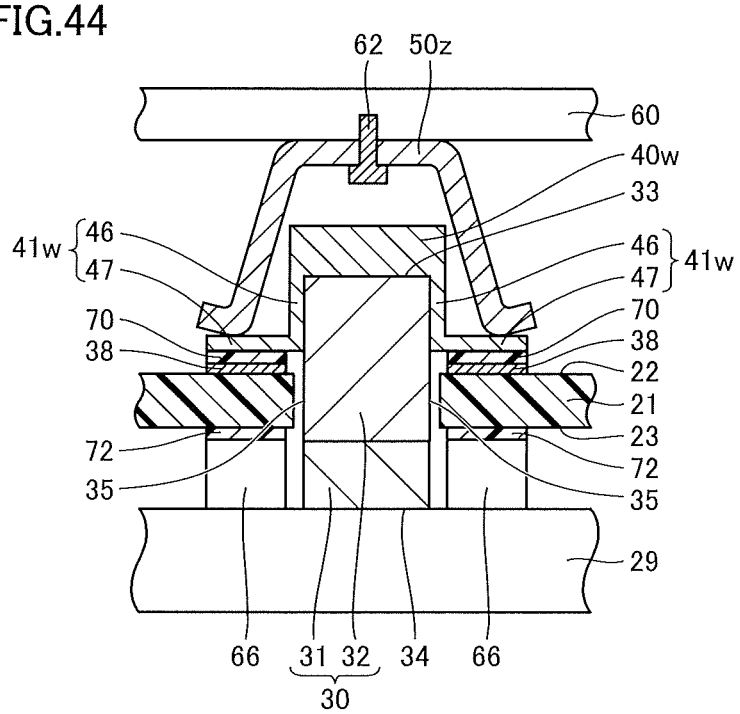
FIG. 44 is a schematic sectional view of the circuit device according to Embodiment 20 of the present invention, which is taken along section line XLIV-XLIV shown in FIG. 42.

A circuit device 20z according to Embodiment 20 will be described with reference to FIGS. 42 to 44. Circuit device 20z of the present embodiment includes similar components and achieves similar effects to those of circuit device 20w of Embodiment 18 but differs from circuit device 20w mainly in the following respects.

In circuit device 20z of the present embodiment, first heat transfer member 40w has projecting portion 41w thermally connected to coil 38. Projection 41w includes first portion 46 projecting toward core 30 and in surface contact with lateral portion 35 of core 30, and second portion 47 covering the main surface of coil 38 and thermally connected to coil 38. An elastic member 50z presses projecting portion 41w of first heat transfer member 40w toward coil 38. Particularly, elastic member 50z presses second portion 47 of projecting portion 41w of first heat transfer member 40w toward coil 38. First heat transfer member 40w is pressed toward core 30 in top portion 33 of core 30 by elastic member 50z pressing projecting portion 41w of first heat transfer member 40w toward coil 38. Elastic member 50z may press second portion 47 of projecting portion 41w toward coil 38 over 50% or more, preferably 65% or more, more preferably 80% or more of the length in the longitudinal direction (horizontal direction of FIG. 42) of second portion 47 of projecting portion 41w.

In circuit device 20z of the present embodiment, elastic member 50z presses projecting portion 41w of first heat transfer member 40w toward coil 38. Projection 41w of first heat transfer member 40w can thus be thermally connected to coil 38 more reliably. The heat generated in coil 38 during the operation of circuit device 20z can be transferred to cover 60 with a lower thermal resistance via first heat transfer member 40w including projecting portion 41w. Circuit device 20z of the present embodiment can prevent or reduce a temperature rise of coil 38 more reliably.

In circuit device 20z of the present embodiment, since elastic member 50z presses projecting portion 41w of first heat transfer member 40w toward coil 38, elastic member 50z presses substrate 21 toward third support struts 66. Thus, substrate 21 can be thermally connected to third support struts 66 more reliably. Some of the heat generated in core 30 and coil 38 during the operation of circuit device 20z is transferred to substrate 21, which can increase the temperature of substrate 21. The heat transferred to substrate 21 can be transferred to first heat dissipation member 29 with a low thermal resistance via third support struts 66 thermally connected to substrate 21. Circuit device 20z of the present embodiment can prevent or reduce a temperature rise of core 30, coil 38, and substrate 21.

In circuit device 20z of the present embodiment, elastic member 50z presses second portion 47 of projecting portion 41w of first heat transfer member 40w toward coil 38. Second heat transfer member 70 located between second portion 47 of projecting portion 41w and coil 38 and third heat transfer member 72 located between substrate 21 and third support struts 66 may accordingly be crushed by the force by which elastic member 50z presses first heat transfer member 40w. Second heat transfer member 70 and third heat transfer member 72 to be crushed have a much lower thermal resistance. The heat generated in core 30 and coil 38 during the operation of circuit device 20z can be transferred to first heat dissipation member 29 and cover 60 with a much lower thermal resistance. Circuit device 20z of the present embodiment can further reduce or prevent a temperature rise of core 30, coil 38, and substrate 21.

In circuit device of Modification 1 of the present embodiment, first heat transfer member 40w may be replaced by first heat transfer member 40x, and first support strut 42 may be used to thermally and mechanically connect first heat transfer member 40x to first heat dissipation member 29, as in circuit device 20x of Modification 1 of Embodiment 18. The heat generated in core 30 during the operation of the circuit device of Modification 1 of the present embodiment can be transferred to first heat dissipation member 29 and cover 60 with a lower thermal resistance via first heat transfer member 40x and first support strut 42. The circuit device of Modification 1 of the present embodiment can further reduce or prevent a temperature rise of core 30.

Figure 45:
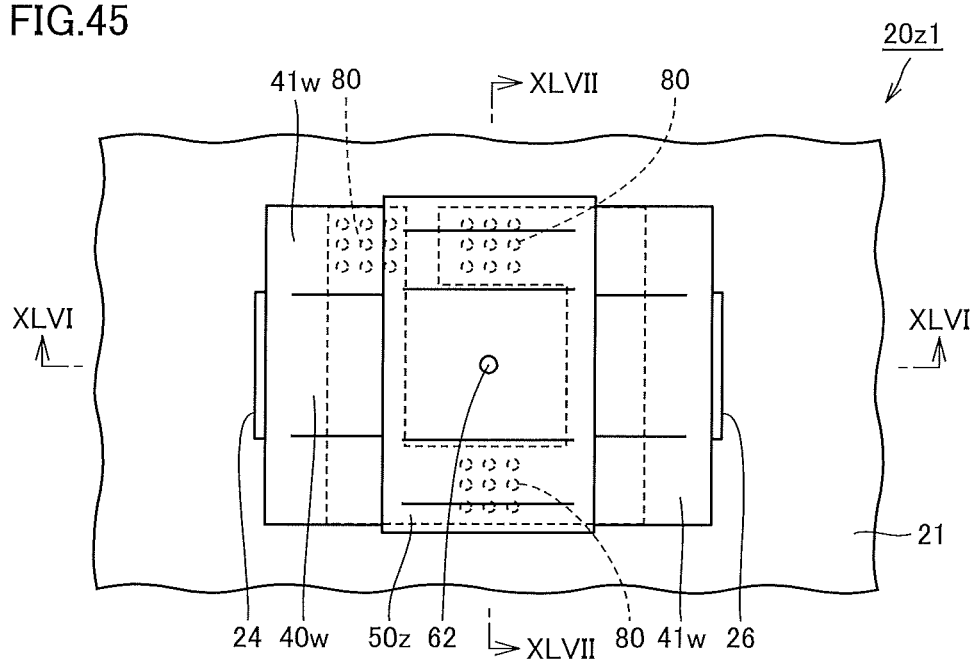
FIG. 45 is a schematic plan view of a circuit device according to Modification 2 of Embodiment 20 of the present invention.
Figure 46:
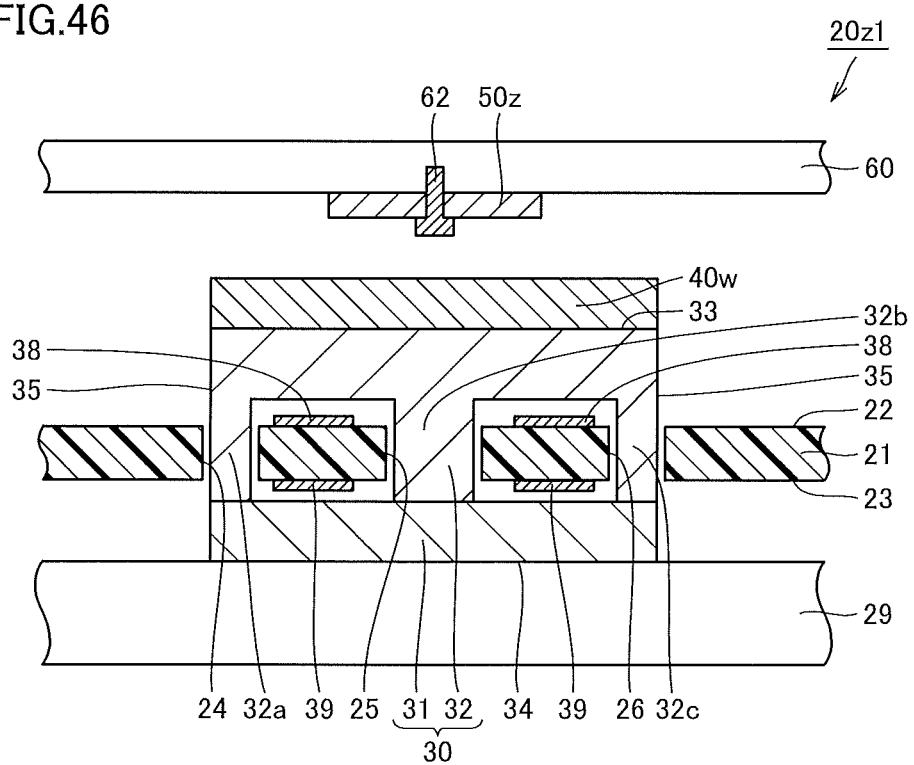
FIG. 46 is a schematic sectional view of the circuit device according to Modification 2 of Embodiment 20 of the present invention, which is taken along section line XLVI-XLVI shown in FIG. 45.
Figure 47:
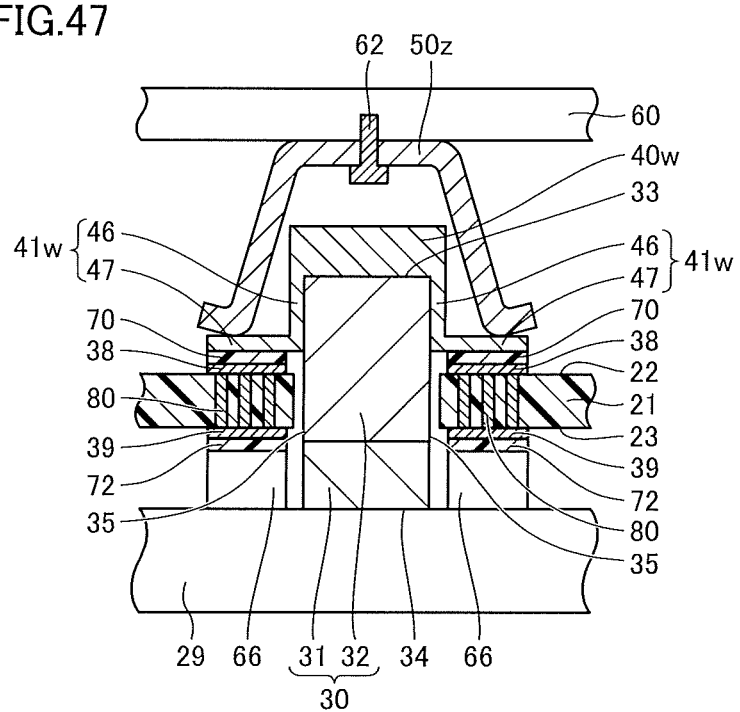
FIG. 47 is a schematic sectional view of the circuit device according to Modification 2 of Embodiment 20 of the present invention, which is taken along section line XLVII-XLVII shown in FIG. 45.

A circuit device 20z1 of Modification 2 of the present embodiment shown in FIGS. 45 to 47 may include second coil 39, third heat transfer member 72, and thermal via 80, similarly to circuit device 20y, 20y1 of Embodiment 19, the modification thereof.

It should be understood that Embodiments 1 to 20 and modifications thereof disclosed herein are illustrative and non-restrictive in every aspect. At least two of the embodiment to Embodiment 20 and the modifications thereof disclosed herein may be combined together as long as there is no inconsistency. For example, in Embodiments 9 to 13 shown in FIGS. 13 to 19, elastic member 50 may be supported by second support strut 52 as in Embodiment 2 shown in FIG. 6. In Embodiments 18 to 20 and the modifications thereof shown in FIGS. 30 to 44, elastic member 50, 50z may be attached to second support strut 52 as in Embodiment 2 shown in FIG. 6 or may be attached to first support strut 42 as in Embodiment 3 shown in FIG. 7. In Embodiments 18 to 20 and the modifications thereof shown in FIGS. 30 to 44, first heat transfer member 40w, 40x may be attached to cover 60 as in Embodiment 15 and the modifications thereof shown in FIGS. 21 and 22. Power converter 1 shown in FIG. 1 may include circuit device 20a-20z1 in Embodiment 2 to Embodiment 20 and the modifications thereof, in place of circuit device 20 of Embodiment 1. The scope of the present invention is defined by the terms of the claims, rather than the embodiments above, and is intended to include any modifications within the scope and meaning equivalent to the terms of the claims.

REFERENCE SIGNS LIST 1 power converter,
10 input terminal,
11 inverter circuit,
11A, 11B, 11C,
11D primary switching element,
12 transformer,
12A primary coil conductor,
12B secondary coil conductor,
13 rectifier circuit,
13A, 13B, 13C, 13D secondary switching element,
14 smoothing circuit,
15 smoothing choke,
16 capacitor,
17 output terminal,
20, 20a, 20b, 20c, 20d, 20e, 20f, 20g, 20h, 20i, 20j, 20k, 20l, 20m, 20n, 20p, 20q, 20r, 20s, 20t, 20u, 20v, 20w, 20x, 20y, 20y1, 20z, 20z1 circuit device,
21 substrate,
22 first main surface,
23 second main surface,
24, 25, 26, 27, 28 through-hole,
29 first heat dissipation member,
30 core,
31 first core portion,
32 second core portion,
32a first leg portion,
32b second leg portion,
32c third leg portion,
33 top portion,
34 bottom portion,
35 lateral portion,
38 coil,
40, 40e, 40f, 40h, 40m, 40n, 40q, 40u, 40w, 40x first heat transfer member, 40s1, 40s2 heat transfer portion,
41h, 41u, 41w, 51n, 51p projecting portion,
42, 42e, 42f, 42g first support strut,
43 first fixing member,
44e, 44f, 44g end,
45 lateral surface,
45n hole,
46 first portion,
47 second portion,
50, 50k, 50l, 50m, 50n, 50p, 50t, 50z elastic member,
50s2, 50s1 elastic portion,
52 second support strut,
53 second fixing member,
60 cover,
60l opening,
62 third fixing member,
63 fourth fixing member,
66 third support strut,
70 second heat transfer member,
72 third heat transfer member,
80 thermal via.

The invention claimed is:

1. A circuit device comprising:
a core having a top portion, a bottom portion opposite to the top portion, and a lateral portion between the top portion and the bottom portion;
a substrate having a first main surface and a second main surface opposite to the first main surface;
a coil disposed on the first main surface and surrounding at least a part of the core;
a first heat transfer member being in surface contact with the top portion of the core;
a first heat dissipation member being in surface contact with the bottom portion of the core and facing the second main surface; and
an elastic member pressing the first heat transfer member toward the core,
the first heat transfer member including a projecting portion thermally connected to the coil,
the first heat transfer member pressing the core toward the first heat dissipation member,
the projecting portion pressing the coil toward the first heat dissipation member.

2. The circuit device according to claim 1, wherein the projecting portion is in surface contact with the lateral portion of the core.

3. The circuit device according to claim 1, further comprising a second heat transfer member being in contact with the projecting portion and the coil and having electrical insulation properties.

4. The circuit device according to claim 1, further comprising a third support strut thermally connecting the substrate to the first heat dissipation member and supporting the substrate.

5. The circuit device according to claim 4, further comprising a third heat transfer member being in contact with the second main surface and the third support strut.

6. The circuit device according to claim 1, further comprising:
a second coil disposed on the second main surface and surrounding at least a part of the core; and
a third support strut thermally connecting the second coil to the first heat dissipation member and supporting the substrate.

7. The circuit device according to claim 6, further comprising a third heat transfer member being in contact with the second coil and the third support strut and having electrical insulation properties.

8. The circuit device according to claim 6, wherein
the substrate includes a thermal via penetrating between the first main surface and the second main surface, and
the thermal via thermally connects the coil and the second coil.

9. The circuit device according to claim 1, wherein the elastic member presses the projecting portion toward the coil.

10. The circuit device according to claim 1, comprising a cover on the top portion of the core,
wherein the elastic member is attached to the cover.

11. The circuit device according to claim 1, comprising a first support strut thermally and mechanically connecting the first heat transfer member to the first heat dissipation member.

12. A power converter comprising the circuit device according to claim 1.

* * * * *